(12) United States Patent
Choi et al.

(10) Patent No.: US 10,128,376 B2
(45) Date of Patent: Nov. 13, 2018

(54) SEMICONDUCTOR DEVICES AND METHODS OF FABRICATING THE SAME

(71) Applicant: SAMSUNG ELECTRONICS CO., LTD., Suwon-si, Gyeonggi-do (KR)

(72) Inventors: Kyungin Choi, Seoul (KR); Changhwa Kim, Hwaseong-si (KR); Taegon Kim, Seoul (KR); Hyunchul Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/613,955

(22) Filed: Jun. 5, 2017

(65) Prior Publication Data

US 2018/0102428 A1    Apr. 12, 2018

(30) Foreign Application Priority Data

Oct. 6, 2016 (KR) .......... 10-2016-0129185

(51) Int. Cl.
| | |
|---|---|
| H01L 27/148 | (2006.01) |
| H01L 29/80 | (2006.01) |
| H01L 29/76 | (2006.01) |
| H01L 21/00 | (2006.01) |
| H01L 21/338 | (2006.01) |
| H01L 21/337 | (2006.01) |
| H01L 29/78 | (2006.01) |
| H01L 29/06 | (2006.01) |

(52) U.S. Cl.
CPC ........ *H01L 29/785* (2013.01); *H01L 29/0649* (2013.01)

(58) Field of Classification Search
CPC ..... H01L 21/823431; H01L 21/823487; H01L 21/823821; H01L 21/823885; H01L 29/785; H01L 29/78642; H01L 29/7926; H01L 27/0886; H01L 27/0924; H01L 27/10841
USPC ........ 257/220, 263, 328, 330, 331; 438/156, 438/173, 192, 212, 268
See application file for complete search history.

(56) References Cited

U.S. PATENT DOCUMENTS

| | | | |
|---|---|---|---|
| 8,431,453 B2 | 4/2013 | Huang et al. | |
| 8,772,102 B2 | 7/2014 | Chi | |
| 9,627,509 B2 * | 4/2017 | Koo | ............ H01L 29/511 |

FOREIGN PATENT DOCUMENTS

KR    10-2008-0001373 A    1/2008

* cited by examiner

*Primary Examiner* — Hsien Ming Lee
(74) *Attorney, Agent, or Firm* — Myers Bigel, P.A.

(57) ABSTRACT

Semiconductor devices and methods of forming the semiconductor devices are provided. The semiconductor devices may include a substrate, a device isolation layer that defines an active region, an active fin vertically protruding from the active region of the substrate and extending in a horizontal direction, a gate structure traversing the active fin, and a source/drain contact on the active fin on a side of the gate structure. The gate structure may include a gate pattern and a capping pattern on the gate pattern, and the capping pattern may have impurities doped therein. The capping pattern may include a first part and a second part between the first part and the gate pattern. The first and second parts may have impurity concentrations different from each other.

20 Claims, 24 Drawing Sheets

SEMICONDUCTOR DEVICES AND METHODS OF FABRICATING THE SAME

CROSS-REFERENCE TO RELATED APPLICATION

This U.S. non-provisional patent application claims priority under 35 U.S.C § 119 to Korean Patent Application 10-2016-0129185 filed on Oct. 6, 2016, the disclosure of which is hereby incorporated by reference in its entirety.

BACKGROUND

The present disclosure generally relates to semiconductor devices and methods of fabricating the same, and more particularly, to semiconductor devices including a fin-type transistor and a method of fabricating the same.

Semiconductor devices have been widely used because of their small size, multi-function, and/or low fabrication cost. Semiconductor devices may be categorized as any one of semiconductor memory devices storing data (e.g., logic data), semiconductor logic devices processing operations of logic data, and hybrid semiconductor devices having both memory and logic elements. As the electronics industry develops, semiconductor devices having high integration density may be beneficial, and semiconductor devices having high reliability, high speed, and/or multifunction may also be beneficial. Accordingly, semiconductor devices have become more and more complicated and highly integrated.

SUMMARY

Example embodiments of the present inventive concepts provide semiconductor devices having enhanced reliability.

According to example embodiments of the present inventive concepts, semiconductor devices may include a substrate, a device isolation layer that defines an active region, an active fin vertically protruding from the active region of the substrate and extending in a horizontal direction, a gate structure traversing the active fin, and a source/drain contact on the active fin on a side of the gate structure. The gate structure may include a gate pattern and a capping pattern on the gate pattern, and the capping pattern may have impurities doped therein. The capping pattern may include a first part and a second part between the first part and the gate pattern. The first and second parts may have impurity concentrations different from each other.

According to example embodiments of the present inventive concepts, semiconductor devices may include a substrate, a device isolation layer that defines an active region, an active fin vertically protruding from the active region of the substrate and extending in a horizontal direction, a gate structure traversing the active fin, a source/drain contact on the active fin on a side of the gate structure, and a spacer between the gate structure. The gate structure may include a gate pattern and a capping pattern on the gate pattern. The spacer may include impurities doped therein. The spacer may comprise a first spacer segment between the gate pattern and the source/drain contact, and a second spacer segment between the capping pattern and the source/drain contact. The first and second spacer segments may have impurity concentrations different from each other.

According to example embodiments of the present inventive concepts, semiconductor devices may include an active region of a substrate, a gate structure on the active region, and a source/drain contact on the active region and on a side of the gate structure. The gate structure may include a gate electrode and a capping pattern sequentially stacked on the active region, the capping pattern may include a first portion that defines an uppermost surface of the gate structure and has a first concentration of first impurities and a second portion having a second concentration of the first impurities that is less than the first concentration of the first impurities.

DETAILED DESCRIPTION OF EMBODIMENTS

Figure 1:
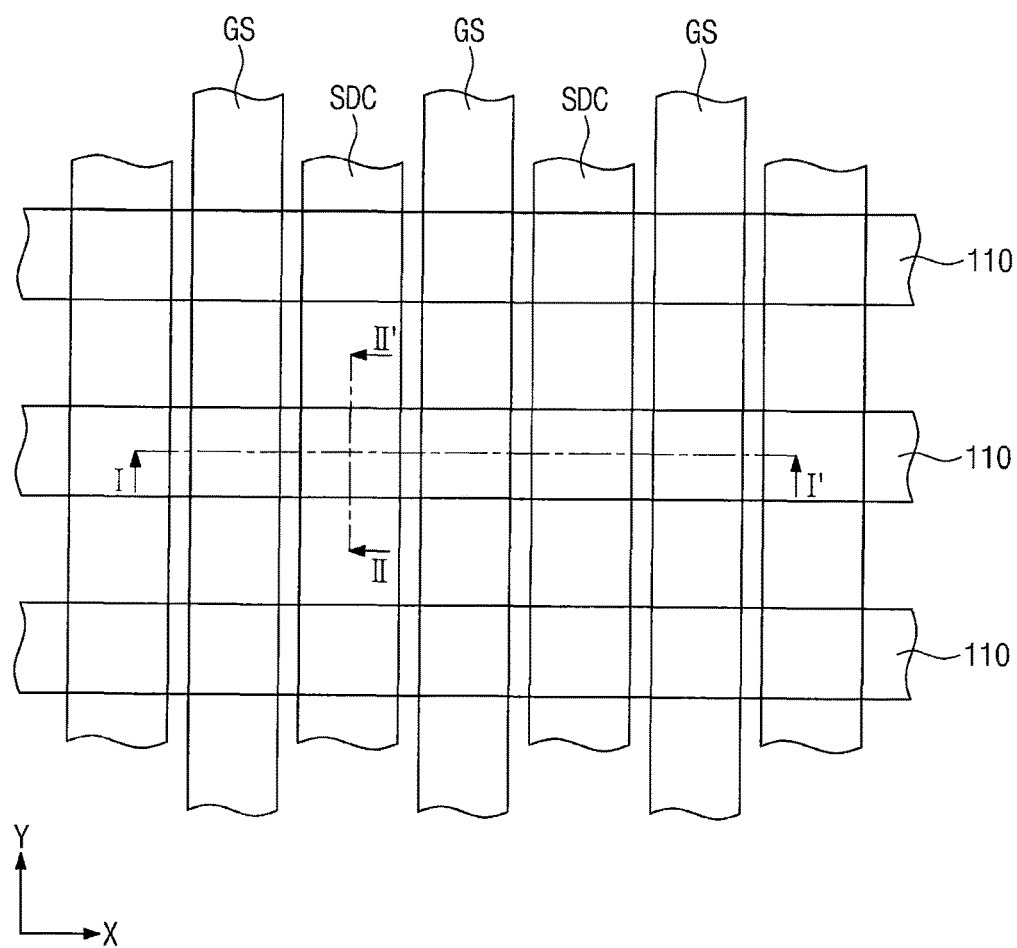
FIG. 1 is a plan view illustrating a semiconductor device according to example embodiments of the present inventive concepts.
Figure 2:
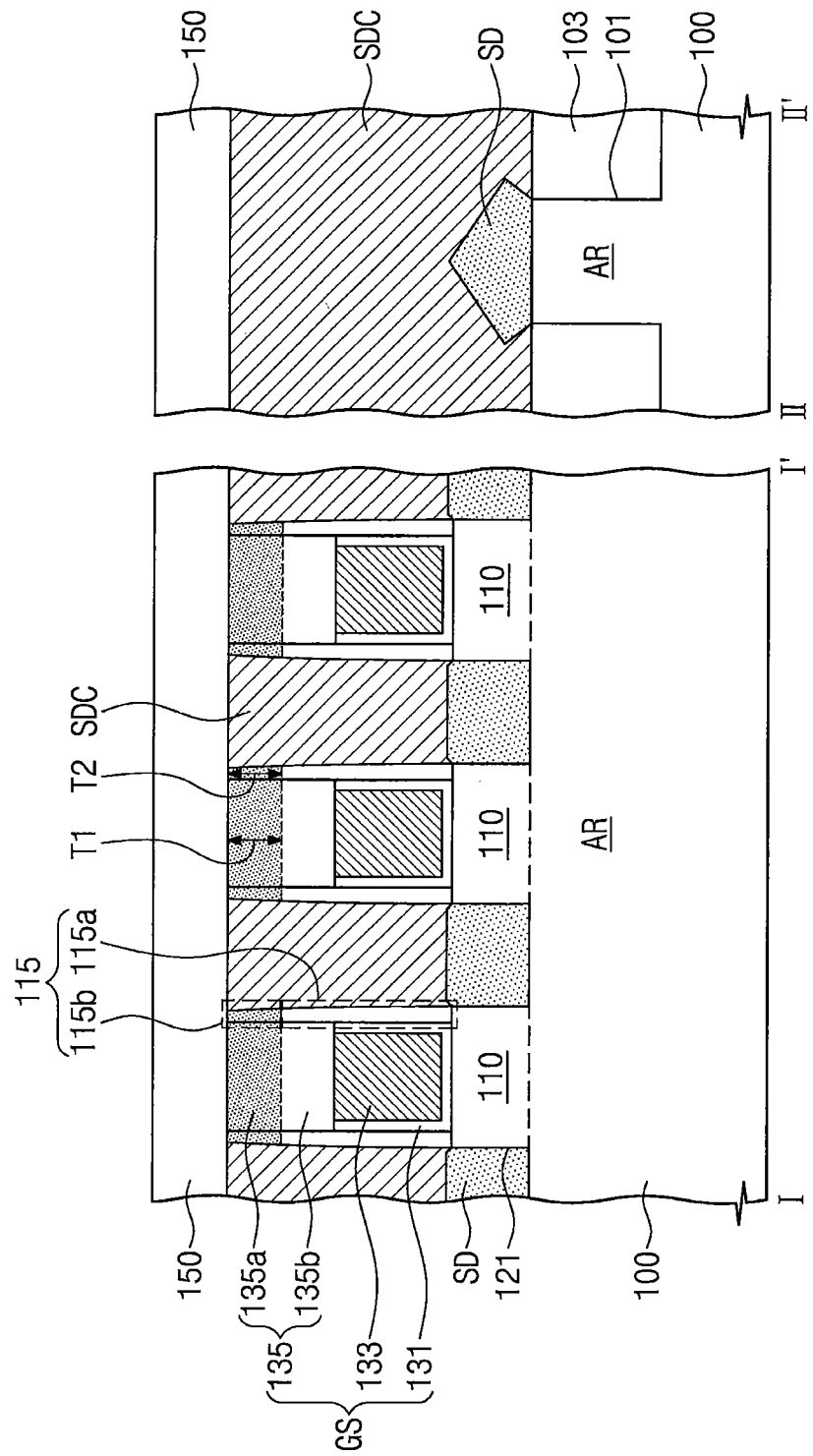
FIG. 2 is a cross-sectional view taken along the lines I-I' and II-II' of FIG. 1 illustrating a semiconductor device according to example embodiments of the present inventive concepts.

FIG. 1 is a plan view illustrating a semiconductor device according to example embodiments of the present inventive concepts. FIG. 2 is a cross-sectional view taken along the lines I-I' and II-IF of FIG. 1 illustrating a semiconductor device according to example embodiments of the present inventive concepts.

Referring to FIGS. 1 and 2, a substrate 100 may be provided therein with a device isolation layer 103 to define an active region AR of the substrate 100. The substrate 100 may be a bulk silicon substrate or an SOI substrate. The device isolation layer 103 may be provided in a trench 101 formed in the substrate 100. The device isolation layer 103 may include, for example, at least one of a silicon oxide layer, a silicon nitride layer, or a silicon oxynitride layer.

Active fins 110 may be provided to protrude from the active region AR of the substrate 100. The active fins 110 may extend in a first direction X and be arranged in a second direction Y crossing the first direction X. The active fins 110 may be parallel to each other. The active fins 110 may have top surfaces positioned higher than a top surface of the device isolation layer 103. In some embodiments, the active fins 110 may be active patterns formed by patterning the substrate 100.

Gate structures GS may be provided to run across the active fins 110. The gate structures GS may extend in the second direction Y and be arranged in the first direction X. The gate structures GS may be parallel to each other. The gate structures GS may be disposed on portions of the top surfaces of the active fins 110 as illustrated in FIG. 2 and on a portion of the top surface of the device isolation layer 103.

Each of the gate structures GS may include a gate dielectric layer 131, a gate pattern 133, and a capping pattern 135. The gate pattern 133 may extend in the second direction Y and run across the active fins 110 and the device isolation layer 103. The gate pattern 133 may include at least one of, for example, a metal nitride material (e.g., TiN, TaN, AlN, WN, MoN), a metallic material (e.g., W, Al, Cu), a silicide material, or a semiconductor material (e.g., Si). The gate dielectric layer 131 may extend onto sidewalls of the gate pattern 133 from between the gate pattern 133 and the active fin 110. For example, the gate dielectric layer 131 may include a silicon oxide layer (e.g., $SiO_2$) or a high-k dielectric layer (e.g., $HfO_2$, HfSiO, HfSiON, HfON, HfAlO, HfLaO, $TaO_2$).

The capping pattern 135 may be disposed on the gate pattern 133 and the gate dielectric layer 131 and may extend in the second direction Y. The capping pattern 135 may include, for example, a silicon nitride layer. In some embodiments, the capping pattern 135 may be doped with impurities. The impurities may be, for example, silicon (Si), boron (B), carbon (C), nitrogen (N), arsenic (As), phosphorous (P), oxygen (O), fluorine (F), argon (Ar), germanium (Ge), hydrogen (H), helium (He), or a combination thereof. The capping pattern 135 may include a first part 135a and a second part 135b between the first part 135a and the gate pattern 133. The first part 135a may have an impurity concentration greater than that of the second part 135b. In some embodiments, the first part 135a may be doped with impurities and the second part 135b may not be doped with impurities.

Spacers 115 may be disposed on opposite sidewalls of each of the gate structures GS, respectively. The spacers 115 may be on sidewalls of the gate dielectric layer 131 and the capping pattern 115. The spacers 115 may include at least one of, for example, a silicon oxide layer or a silicon oxynitride layer. In some embodiments, the spacers 115 may be doped with impurities. For example, the impurities doped in the spacers 115 may be substantially the same as the impurities doped in the capping pattern 135. The impurities doped in the spacers 115 may be, for example, silicon (Si), boron (B), carbon (C), nitrogen (N), arsenic (As), phosphorous (P), oxygen (O), fluorine (F), argon (Ar), germanium (Ge), hydrogen (H), helium (He), or a combination thereof. Each of the spacers 115 may include a first spacer segment 115a and a second spacer segment 115b on the first spacer segment 115a. In detail, the first spacer segment 115a may be on the sidewall of the gate dielectric layer 131 and a sidewall of the second part 135b of the capping pattern 135, and the second spacer segment 115b may be on a sidewall of the first part 135a of the capping pattern 135. In some embodiments, the second spacer segment 115b may have a thickness T2 substantially the same as that T1 of the first part 135a as illustrated in FIG. 2.

The second spacer segment 115b may have an impurity concentration greater than that of the first spacer segment 115a. The impurity concentration of the second spacer segment 115b may be substantially the same as that of the first part 135a. The impurity concentration of the first spacer segment 115a may be substantially the same as that of the second part 135b. In some embodiments, the first spacer segment 115a may not be doped with impurities and the second spacer segment 115b may be doped with impurities.

Source/drain patterns SD may be disposed in the active fins 110 between the gate structures GS. For example, the source/drain patterns SD may be provided in recess regions 121 formed in the active fins 110 between the gate structures GS. The source/drain patterns SD may be spaced apart from each other in the second direction Y and may also be spaced apart from each other in the first direction X across the gate structures GS. The source/drain patterns SD may have top surfaces positioned at substantially the same level as or higher than those of the active fins 110. The active fins 110 may have portions disposed between the source/drain patterns SD adjacent to each other in the first direction X and overlapped with the gate structures GS, and the portions of the active fins 110 may be used as channel regions of transistors.

The source/drain patterns SD may be, for example, an epitaxial layer formed by an epitaxial growth process using top and side surfaces of the active fins 110 exposed through the recess regions 121 as a seed. For example, the source/drain patterns SD may include at least one of silicon germanium (SiGe), silicon (Si), or silicon carbide (SiC) grown by an epitaxial growth process where the active fins 110 are used as a seed. For example, when a semiconductor device according to the present inventive concepts has a CMOS structure, the source/drain patterns SD of NMOSFETs may include a first epitaxial layer and the source/drain patterns SD of PMOSFETs may include a second epitaxial layer. The first epitaxial layer may be configured to provide a tensile strain to a channel region (i.e., an active fin) of NMOSFET, and the second epitaxial layer may be configured to provide a compressive strain to a channel region (i.e., an active fin) of PMOSFET. The first epitaxial layer may include silicon (Si) and/or silicon carbide (SiC), and the second epitaxial layer may include silicon germanium (SiGe). The example embodiments of the present inventive concepts, however, are not limited thereto.

The source/drain patterns SD may further include impurities. The impurities may be utilized to improve electrical characteristics. For example, when a transistor is an NMOSFET, the impurities may be phosphorous (P). For example, when a transistor is a PMOSFET, the impurities may be boron (B).

A source/drain contact SDC may be disposed on the source/drain patterns SD. The source/drain contact SDC may extend in the second direction Y and may be electrically connected to a plurality of the source/drain patterns SD arranged in the second direction Y. For example, a single source/drain contact SDC may be connected in common to a plurality of the source/drain patterns SD. In some embodiments, the source/drain contact SDC may be in contact with outer sidewalls of the spacers 115 disposed on its opposite sides as illustrated in FIG. 2. The source/drain contact SDC may have a top surface positioned at substantially the same level as that of the capping pattern 135. In some embodiments, the top surfaces of the source/drain contact SDC and the capping pattern 135 are coplanar and are spaced apart from the substrate 100 by an equal distance as illustrated in FIG. 2. The source/drain contact SDC may include at least one of, for example, a doped semiconductor material, a metallic material, or a metal nitride material.

An interlayer dielectric layer 150 may be disposed on the gate structures GS and the source/drain contact SDC. The interlayer dielectric layer 150 may be on the top surfaces of the capping pattern 135 and the source/drain contact SDC and may be also on top surfaces of the spacers 115. In some embodiments, the interlayer dielectric layer 150 may cover the top surfaces of the capping pattern 135, the source/drain contact SDC and top surfaces of the spacers 115. The interlayer dielectric layer 150 may include, for example, a silicon oxide layer or a silicon nitride layer.

Figure 3:
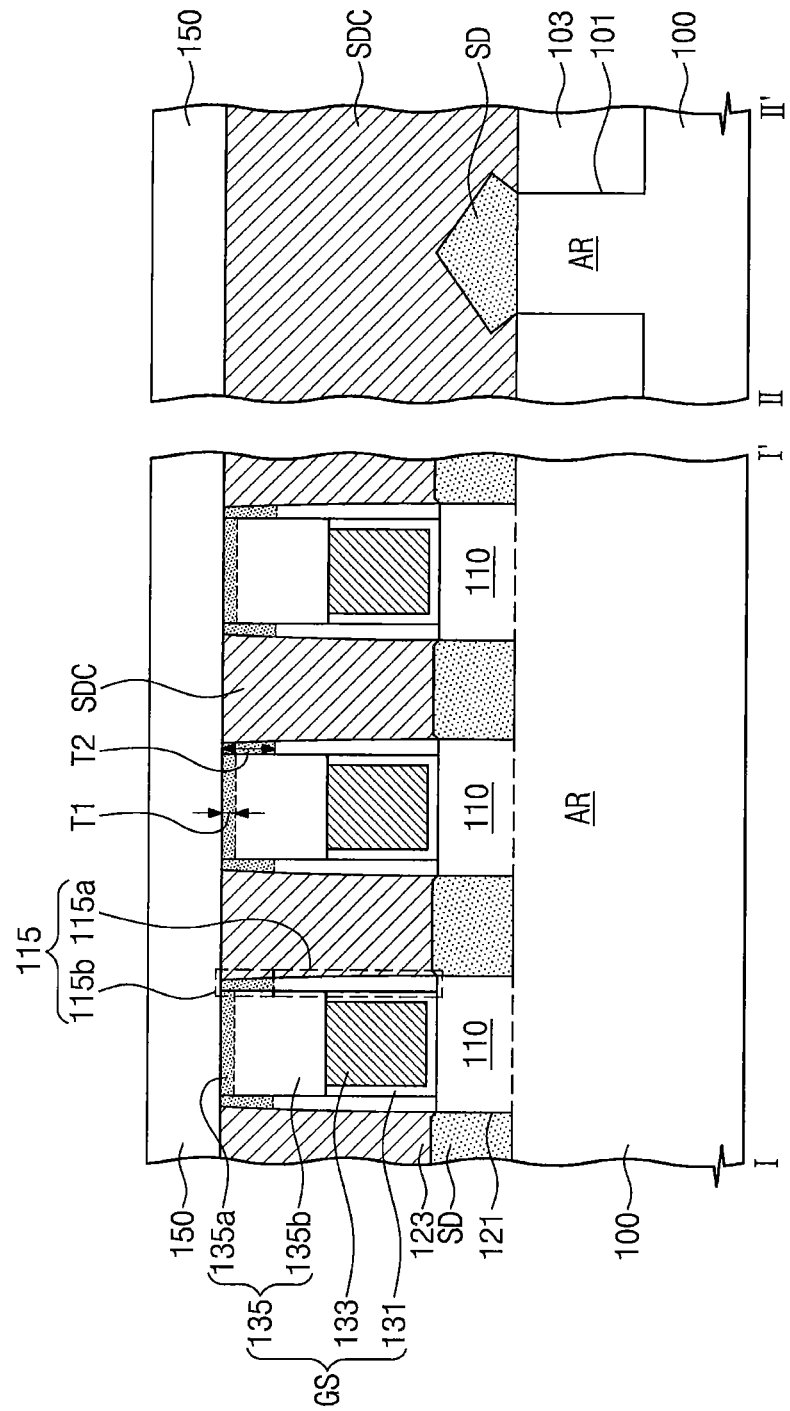
FIG. 3 is a cross-sectional view taken along the lines I-I' and of FIG. 1 illustrating a semiconductor device according to example embodiments of the present inventive concepts.

FIG. 3 is a cross-sectional view taken along the lines I-I' and II-IF of FIG. 1 illustrating a semiconductor device according to example embodiments of the present inventive concepts. For brevity of the description, those components substantially the same as those discussed above are allocated the same reference numerals thereto, and a detailed explanation thereof will be omitted.

Referring to FIG. 3, the thickness T1 of the first part 135a of the capping pattern 135 may be less than that T2 of the second spacer segment 115b. The second spacer segment 115b may be on both the sidewall of the first part 135a and an upper sidewall of the second part 135b.

Figure 4:
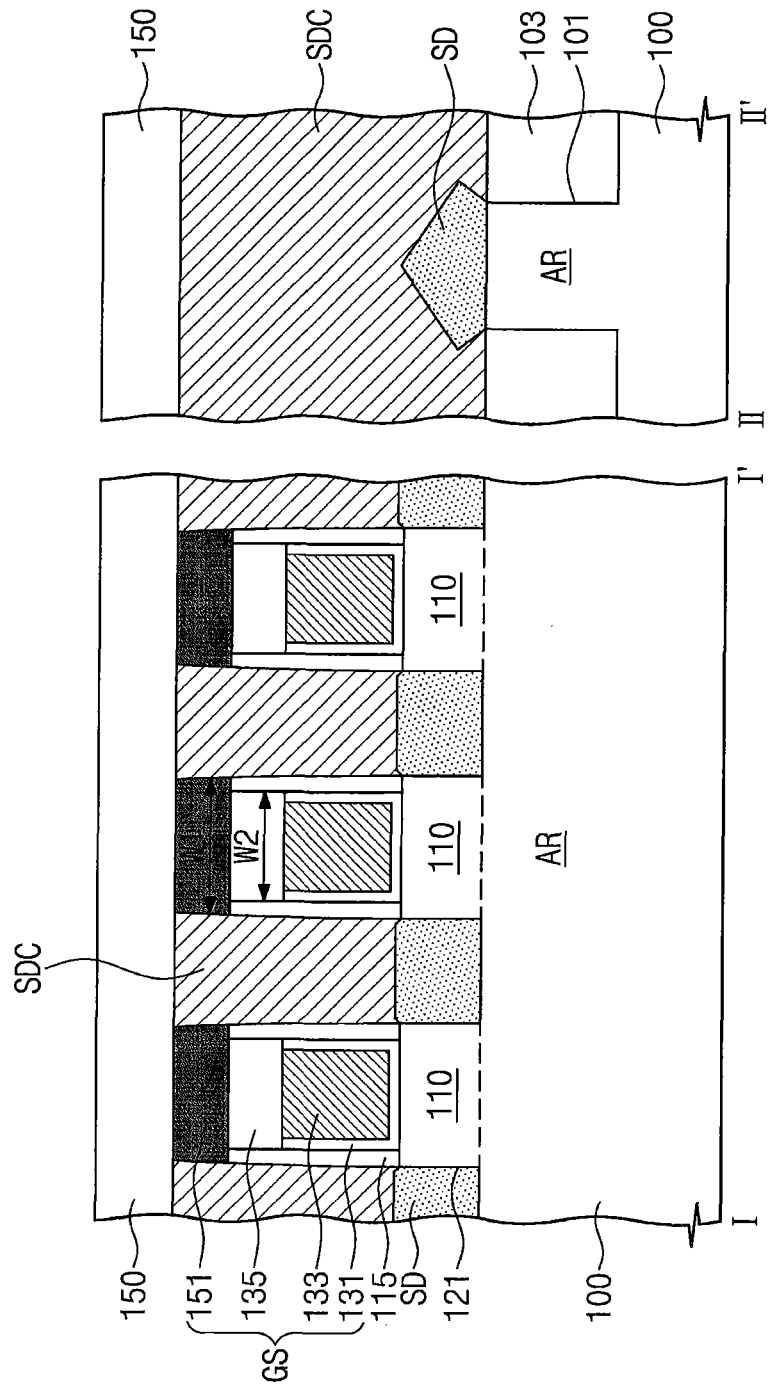
FIG. 4 is a cross-sectional view taken along the lines I-I' and II-II' of FIG. 1 illustrating a semiconductor device according to example embodiments of the present inventive concepts.

FIG. 4 is a cross-sectional view taken along the lines I-I' and II-IF of FIG. 1 illustrating a semiconductor device according to example embodiments of the present inventive concepts. For brevity of the description, those components substantially the same as those discussed above are allocated the same reference numerals thereto, and a detailed explanation thereof will be omitted.

Referring to FIG. 4, each of the gate structures GS may include a gate dielectric layer 131, a gate pattern 133, an upper capping pattern 151, and a lower capping pattern 135. The gate pattern 133 may extend in the second direction Y and run across the active fins 110 and the device isolation layer 103. The gate dielectric layer 131 may extend onto sidewalls of the gate pattern 133 from between the gate pattern 133 and the active fin 110.

The upper capping pattern 151 may be disposed on the gate pattern 133 and the gate dielectric layer 131. In some embodiments, the upper capping pattern 151 may have a width W1 substantially the same as a sum of a width of the gate pattern 133, a width of the gate dielectric layer 131 disposed on one sidewall of the gate pattern 133, a width of the gate dielectric layer 131 disposed on an opposite sidewall of the gate pattern 133, and widths of two spacers 115 as illustrated in FIG. 4. The upper capping pattern 151 may have outer sidewalls in contact with the source/drain contact SDC. The upper capping pattern 151 may have a top surface at substantially the same level as that of the source/drain contact SDC. In some embodiments, the top surfaces of the upper capping pattern 151 and the source/drain contact SDC may be coplanar and may be spaced apart from the substrate 100 by an equal distance as illustrated in FIG. 4. The upper capping pattern 151 may be an insulating layer doped with impurities. The impurities may be, for example, silicon (Si), boron (B), carbon (C), nitrogen (N), arsenic (As), phosphorous (P), oxygen (O), fluorine (F), argon (Ar), germanium (Ge), hydrogen (H), or helium (He). The upper capping pattern 151 may include, for example, a silicon nitride layer.

The lower capping pattern 135 may be disposed between the gate pattern 133 and the upper capping pattern 151. The lower capping pattern 135 may be in contact with a top surface of the gate dielectric layer 131. The lower capping pattern 135 may have a width W2 less than that W1 of the upper capping pattern 151. The lower capping pattern 135 may be spaced apart from the source/drain contact SDC. The lower capping pattern 135 may include the same material as that of the upper capping pattern 151. For example, the lower capping pattern 135 may include a silicon nitride layer. In some embodiments, unlike the upper capping pattern 151, the lower capping pattern 135 may not be doped with impurities.

The spacer 115 may extend between the lower capping pattern 135 and the source/drain contact SDC from between the gate dielectric layer 131 and the source/drain contact SDC. The top surface of the spacer 115 may be in contact with the upper capping pattern 151. The outer sidewall of the spacer 115 may be in contact with the source/drain contact SDC. In some embodiments, no impurity may be doped in the spacer 115.

Figure 5:
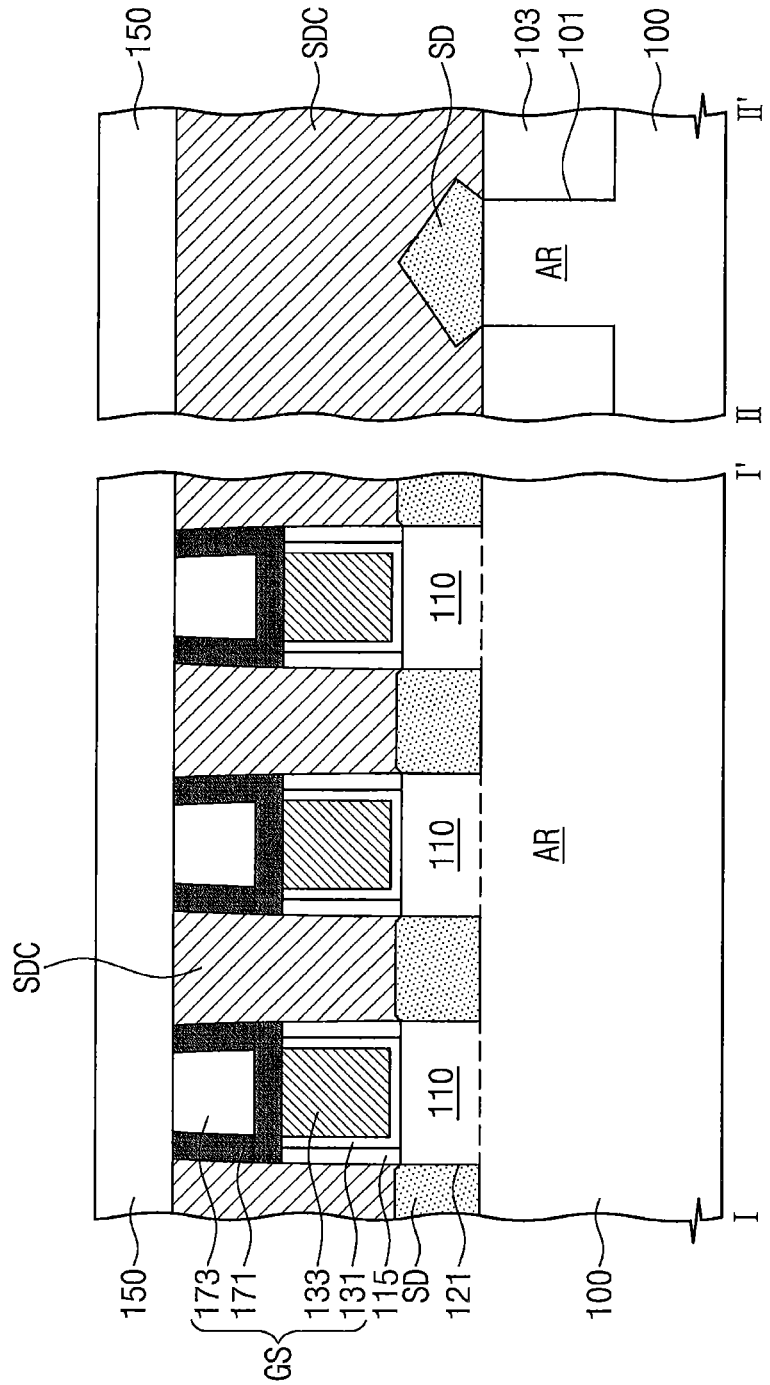
FIG. 5 is a cross-sectional view taken along the lines I-I' and II-II' of FIG. 1 illustrating a semiconductor device according to example embodiments of the present inventive concepts.

FIG. 5 is a cross-sectional view taken along the lines I-I' and II-II' of FIG. 1 illustrating a semiconductor device according to example embodiments of the present inventive concepts. For brevity of the description, those components substantially the same as those discussed above are allocated the same reference numerals thereto, and a detailed explanation thereof will be omitted.

Referring to FIG. 5, each of the gate structures GS may include a gate dielectric layer 131, a gate pattern 133, a lower capping pattern 171, and an upper capping pattern 173. The gate pattern 133 may extend in the second direction Y and run across the active fins 110 and the device isolation layer 103. The gate dielectric layer 131 may extend onto sidewalls of the gate pattern 133 from between the gate pattern 133 and the active fin 110.

The upper capping pattern 173 may be disposed on the gate pattern 133 and the gate dielectric layer 131. The upper capping pattern 173 may have a top surface at substantially the same level as that of the source/drain contact SDC. In some embodiments, the top surfaces of the upper capping pattern 173 and the source/drain contact SDC may be coplanar and may be spaced apart from the substrate 100 by an equal distance as illustrated in FIG. 5. The upper capping pattern 173 may have sidewalls spaced apart from the source/drain contact SDC. The upper capping pattern 173 may include, for example, a silicon nitride layer.

The lower capping pattern 171 may be disposed between the gate pattern 133 and the upper capping pattern 173. The lower capping pattern 171 may extend between the upper capping pattern 173 and the source/drain contact SDC from between the gate pattern 133 and the upper capping pattern 173. Accordingly, the upper capping pattern 173 may be disposed an inner space defined by the lower capping pattern 171. Top surfaces of the lower and upper capping patterns 171 and 173 may be positioned at substantially the same level as that of the source/drain contact SDC. In some embodiments, the top surface of the source/drain contact SDC and the top surface of the lower and upper capping patterns 171 and 173 may be coplanar and may be spaced apart from the substrate 100 by an equal distance as illustrated in FIG. 5. The lower capping pattern 171 may include the same material as that of the upper capping pattern 173. For example, the lower capping pattern 171 may include a silicon nitride layer. In some embodiments, the lower capping pattern 171 may be doped with impurities. The impurities may be, for example, silicon (Si), boron (B), carbon (C), nitrogen (N), arsenic (As), phosphorous (P), oxygen (O), fluorine (F), argon (Ar), germanium (Ge), hydrogen (H), helium (He), or a combination thereof. Unlike the lower capping pattern 171, no impurity may be doped in the upper capping pattern 173.

The spacer 115 may be disposed between the gate dielectric layer 131 and the source/drain contact SDC. The top surface of the spacer 115 may be in contact with the lower capping pattern 171. The outer sidewall of the spacer 115 may be in contact with the source/drain contact SDC. In some embodiments, no impurity may be doped in the spacer 115.

Figure 6:
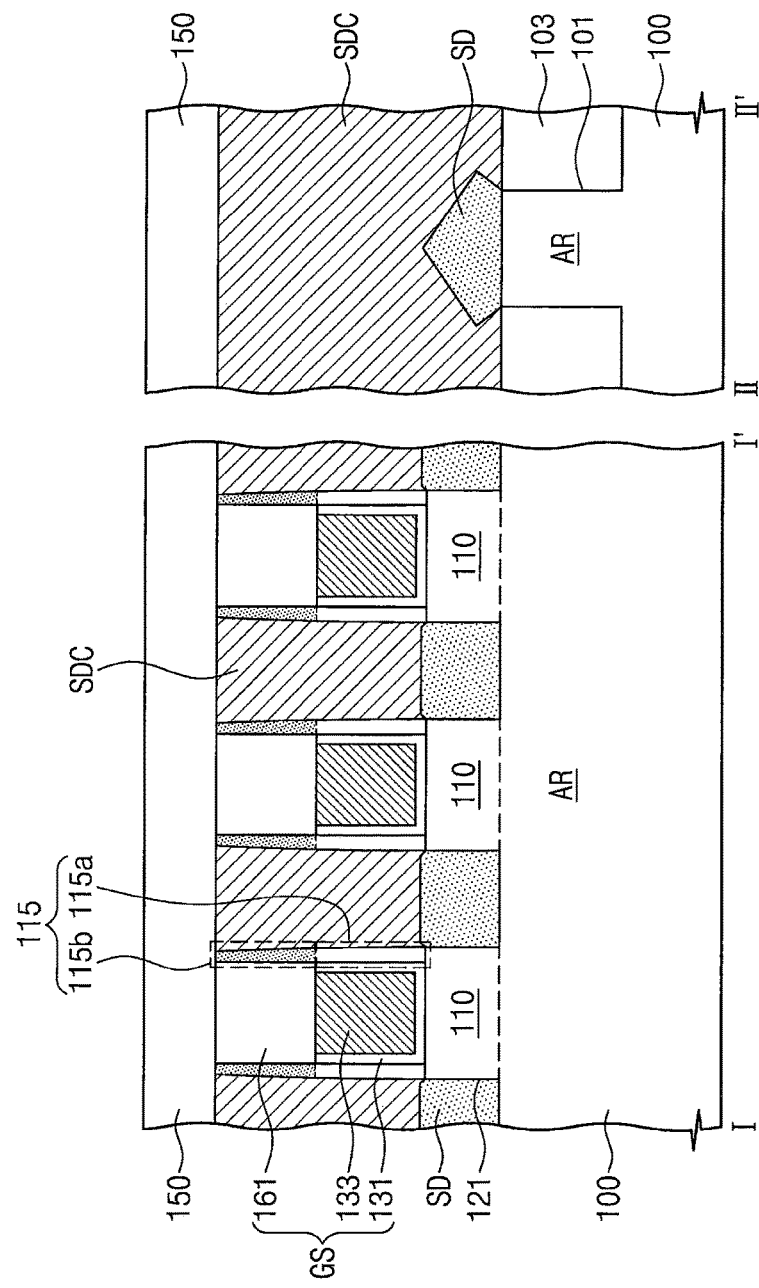
FIG. 6 is a cross-sectional view taken along the lines I-I' and II-IF of FIG. 1 illustrating a semiconductor device according to example embodiments of the present inventive concepts.

FIG. 6 is a cross-sectional view taken along the lines I-I' and II-IF of FIG. 1 illustrating a semiconductor device according to example embodiments of the present inventive concepts. For brevity of the description, those components substantially the same as those discussed above are allocated the same reference numerals thereto, and a detailed explanation thereof will be omitted.

Referring to FIG. 6, each of the gate structures GS may include a gate dielectric layer 131, a gate pattern 133, and a capping pattern 161. The capping pattern 161 may be disposed on the gate dielectric layer 131 and the gate pattern 133. The capping pattern 161 may have a top surface at substantially the same level as that of the source/drain contact SDC. In some embodiments, the top surfaces of the capping pattern 161 and the source/drain contact SDC may be coplanar and may be spaced apart from the substrate 100 by an equal distance as illustrated in FIG. 6. In some embodiments, no impurity may be doped in the capping pattern 161. The capping pattern 161 may include, for example, a silicon nitride layer.

The spacer 115 may extend between the capping pattern 161 and the source/drain contact SDC from between the gate dielectric layer 131 and the source/drain contact SDC. The outer sidewall of the spacer 115 may be in contact with the source/drain contact SDC. The spacer 115 may include a first spacer segment 115a and a second spacer segment 115b on the first spacer segment 115a. The first spacer segment 115a may be disposed between the gate dielectric layer 131 and the source/drain contact SDC, and the second spacer segment 115b may be disposed between the capping pattern 161 and the source/drain contact SDC. In some embodiments, the first spacer segment 115a may not be doped with impurities and the second spacer segment 115b may be doped with impurities. The impurities may be, for example, silicon (Si), boron (B), carbon (C), nitrogen (N), arsenic (As), phosphorous (P), oxygen (O), fluorine (F), argon (Ar), germanium (Ge), hydrogen (H), helium (He), or a combination thereof.

FIGS. 7A to 7F are cross-sectional views taken along the lines I-I' and II-IF of FIG. 1 illustrating a method of fabricating a semiconductor device according to example embodiments of the present inventive concepts.

Figure 7A:
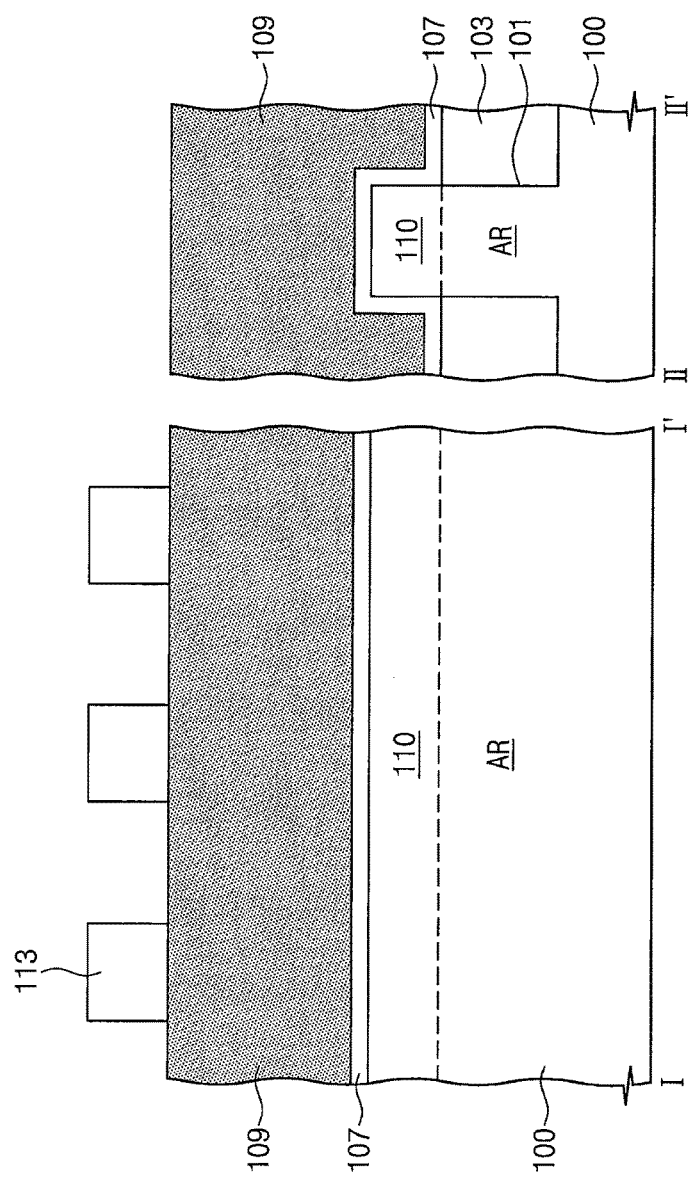
FIGS. 7A to 7F are cross-sectional views taken along the lines IT and II-IF of FIG. 1 illustrating a method of fabricating a semiconductor device according to example embodiments of the present inventive concepts.

Referring to FIG. 7A, a trench 101 may be formed in a substrate 100. The substrate 100 may be a bulk silicon substrate or an SOI substrate. The trench 101 may be formed by forming a mask pattern (not shown) on the substrate 100 and anisotropically etching an upper portion of the substrate 100 using the mask pattern as an etching mask. A device isolation layer 103 may be formed in the trench 101. The device isolation layer 103 may be formed by forming an insulating layer to fill the trench 101 and performing a planarization process until exposing a top surface of the substrate 100. The device isolation layer 103 may define an active region AR of the substrate 100. The device isolation layer 103 may include, for example, at least one of a silicon oxide layer, a silicon nitride layer, or a silicon oxynitride layer.

The device isolation layer 103 may be etched on its upper portion to form active fins 110 vertically protruding from the active region AR. The active fins 110 may have top surfaces positioned higher than that of the device isolation layer 103. The active fins 110 may correspond to an upper portion of the active region AR. The active fins 110 may extend in a first direction X and be arranged in a second direction Y crossing the first direction X.

An etch stop layer 107 may be formed on the active fins 110 and the device isolation layer 103. In some embodiments, the etch stop layer 107 may be formed conformally on the top surfaces of the device isolation layer 103 and the active fins 110 and may also be formed conformally on side surfaces of the active fins 110 as illustrated in FIG. 7A. For example, the etch stop layer 107 may include an oxide layer (e.g., a silicon oxide layer or a high-k dielectric layer) or a silicon nitride layer. A sacrificial layer 109 may be formed on the etch stop layer 107. The sacrificial layer 109 may include at least one layer having an etch selectivity with respect to the etch stop layer 107. For example, the sacrificial layer 109 may include a polysilicon layer.

Mask patterns 113 may be formed on the sacrificial layer 109. The mask patterns 113 may extend in the second direction Y and be arranged in the first direction X. The mask patterns 113 may include, for example, a silicon oxide layer.

Figure 7B:
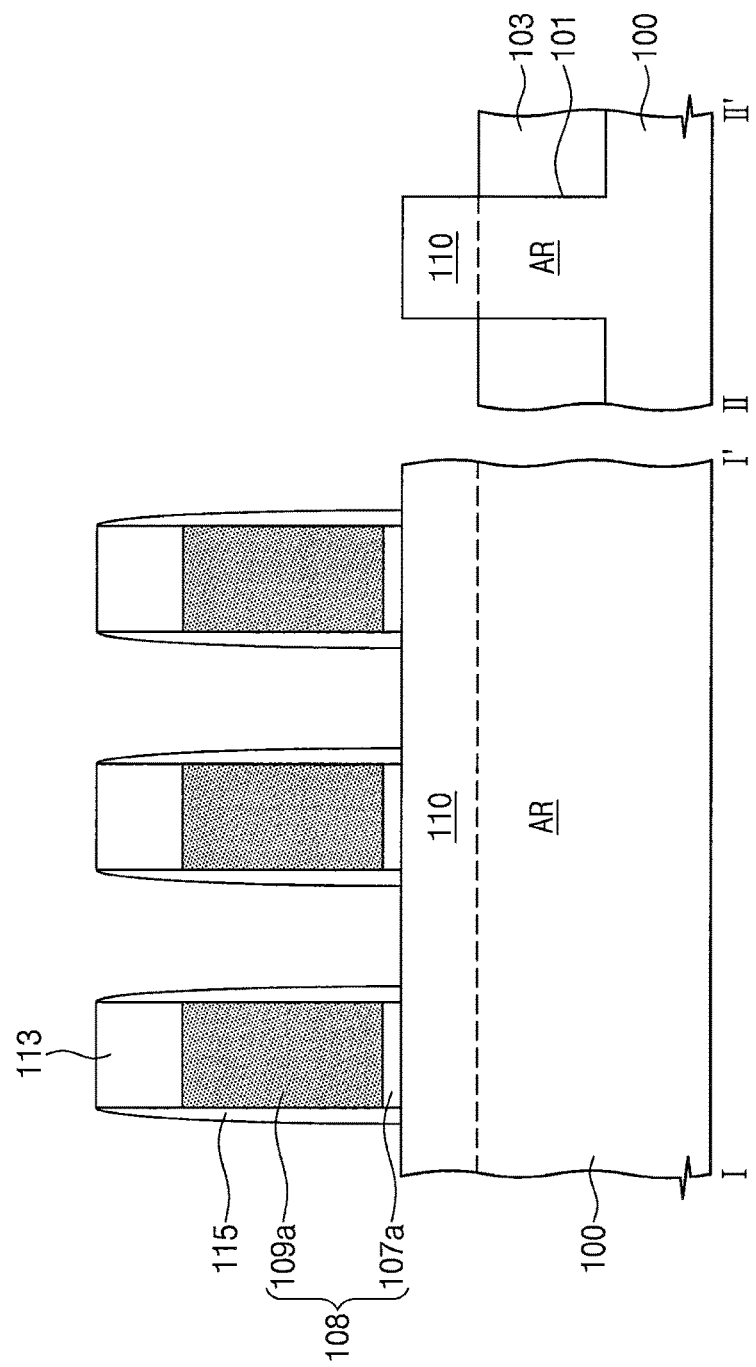

Referring to FIG. 7B, the sacrificial layer 109 and the etch stop layer 107 may be sequentially patterned using the mask patterns 113 as an etching mask. Thus, sacrificial structures 108 may be formed on the substrate 100. Each of the sacrificial structures 108 may include an etch stop pattern 107a and a sacrificial pattern 109a that are sequentially formed on the substrate 100. The sacrificial structures 108 may extend in the second direction Y and run across the active fins 110 and the device isolation layer 103. The sacrificial structures 108 may be arranged in the first direction X. The active fins 110 and the device isolation layer 103 may be partially exposed between the sacrificial structures 108.

Spacers 115 may be formed on sidewalls of the sacrificial structures 108 and sidewalls of the mask patterns 113. For example, each of the spacers 115 may cover a sidewall of the etch stop pattern 107a, a sidewall of the sacrificial pattern 109a, and the sidewall of each of the mask patterns 113. The spacers 115 may extend in the second direction Y along the sidewalls of the sacrificial structures 108 and the sidewalls of the mask patterns 113. The spacers 115 may include at least one of, for example, a silicon nitride layer or a silicon oxynitride layer.

Figure 7C:
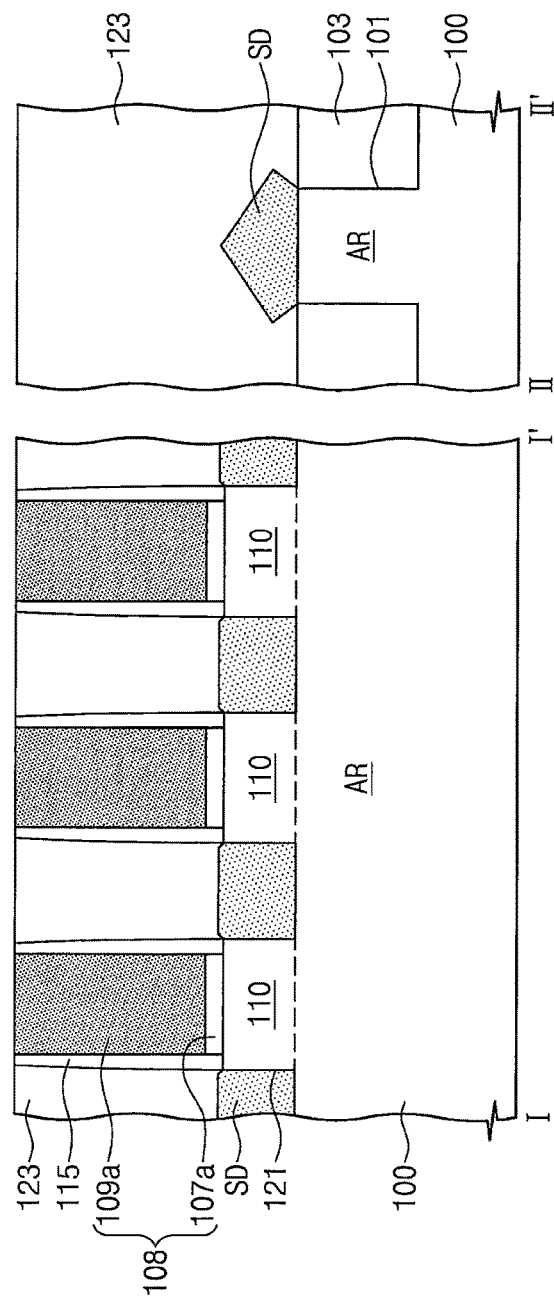

Referring to FIG. 7C, source/drain patterns SD may be formed in the active fins 110 between the sacrificial structures 108. The formation of the source/drain patterns SD may include forming recess regions 121 in the active fins 110 by etching portions of the active fins 110 exposed between the sacrificial structures 108, and forming epitaxial layers in the recess regions 121 by performing an epitaxial process using the top and side surfaces of the active fins 110 exposed through the recess regions 121 as a seed. The recess regions 121 may have bottom surfaces positioned at substantially the same level as the top surface of the device isolation layer 103. In some embodiments, the bottom surfaces of the recess regions 121 and the top surface of the device isolation layer 103 may be coplanar and may be spaced apart from the substrate 100 by an equal distance as illustrated in FIG. 7C. For example, the source/drain patterns SD may be formed as a diamond shape. The source/drain patterns SD may have top surfaces positioned at substantially the same level as or higher than those of the active fins 110.

When a semiconductor device has a CMOS structure, the formation of the epitaxial layers may include forming the source/drain patterns SD of NMOS transistors and forming the source/drain patterns SD of PMOS transistors. The source/drain patterns SD of NMOS transistors may be formed of a tensile strain inducing material, for example, silicon (Si), or silicon carbide (SiC). The source/drain patterns SD of PMOS transistors may be formed of a compressive strain inducing material, for example, silicon germanium (SiGe).

Unlike that illustrated in FIG. 7C, the source/drain patterns SD may be formed by implanting impurity ions into portions of the active fins 110 exposed between the sacrificial structures 108. In this case, the source/drain patterns SD of PMOS transistors may be p-type impurity doped regions, and the source/drain patterns SD of NMOS transistors may be n-type impurity doped regions.

The active fins 110 may have portions between the source/drain patterns SD adjacent to each other in the first direction X, and the portions of the active fins 110 may be used as channel regions of transistors.

An insulation layer 123 may be formed on the substrate 100. The insulation layer 123 may be formed by forming an insulating layer on the substrate 100 to cover the top surfaces of the device isolation layer 103 and the source/drain patterns SD and performing a planarization process on the insulating layer so as to expose top surfaces of the sacrificial patterns 109a. The planarization process may remove the mask patterns 113 and upper portions of the spacers 115. The insulation layer 123 may fill spaces between the sacrificial structures 108. The insulation layer 123 may include, for example, a silicon oxide layer.

Figure 7D:
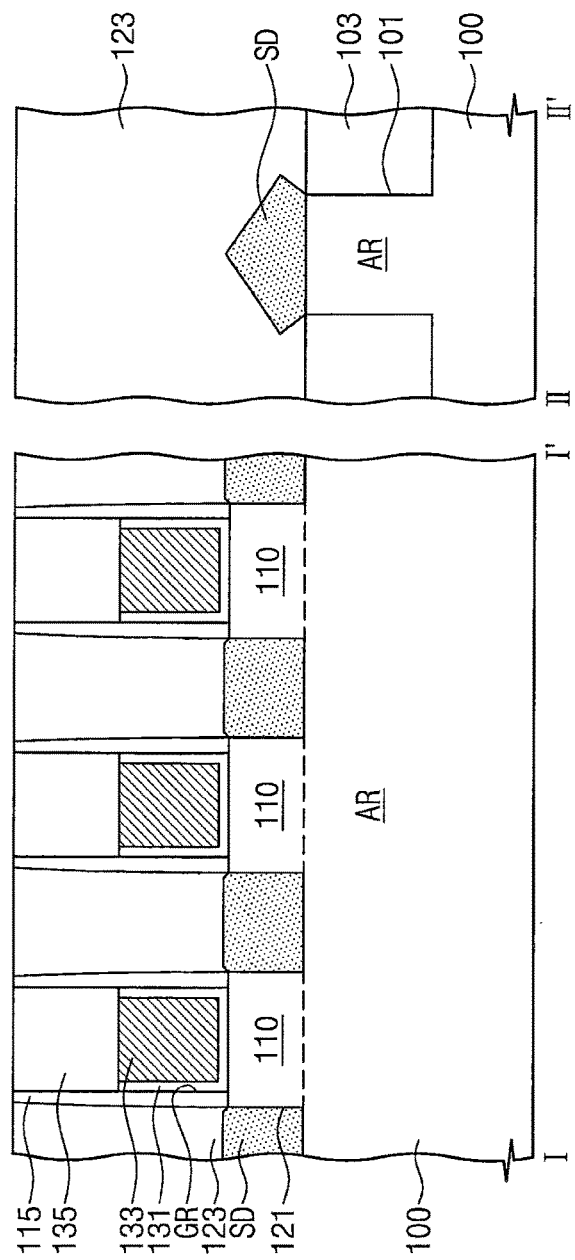

Referring to FIG. 7D, gap regions GR may be formed by removing the sacrificial structures 108 each including the etch stop pattern 107a and the sacrificial pattern 109a. The gap regions GR may be formed to run across the active fins 110. The gap regions GR may expose portions of the active fins 110 disposed between the source/drain patterns SD facing in the first direction X and portions of the device isolation layer 103. The gap regions GR may also expose inner sidewalls of the spacers 115. The etch stop pattern 107a and the sacrificial pattern 109a may be selectively removed using an etch recipe having an etch selectivity with respect to the spacers 115 and the substrate 100.

Gate dielectric layers 131 may be formed in the gap regions GR. The gate dielectric layers 131 may conformally formed on the inner sidewalls of the spacers 115 exposed through the gap regions GR, the top surfaces of the active fins 110 exposed through the gap regions GR, and the top surfaces of portions of the device isolation layer 103. The gate dielectric layer 131 may include, for example, a silicon oxide layer or a high-k dielectric layer (e.g., $HfO_2$, HfSiO, HfSiON, HfON, HfAlO, HfLaO, $TaO_2$).

Gate patterns 133 may be formed on the gate dielectric layers 131 in the gap regions GR. The formation of the gate patterns 133 may include forming a conductive layer (not shown) to cover a top surface of the insulation layer 123 and fill the gap regions GR including the gate dielectric layers 131 formed therein, and performing a planarization process on the conductive layer so as to expose the top surface of the insulation layer 123. Thereafter, the gate patterns 133 may be etched on their upper portions such that the gate patterns 133 may be recessed lower than the top surface of the insulation layer 123. Therefore, the gate patterns 133 may locally fill lower portions of the gap regions GR. The gate dielectric layers 131 may also be etched on their upper portions during etching the upper portions of the gate patterns 133. As a result, the inner sidewalls of the spacers 115 may be partially exposed. In some embodiments, the gate dielectric layers 131 may have top surfaces positioned at substantially the same level as those of the gate patterns 133 as illustrated in FIG. 7D.

The gate patterns 133 may extend in the second direction Y and run across the active fins 110 and the device isolation layer 103. The gate patterns 133 may be gate electrodes constituting transistors. The gate patterns 133 may include, for example, at least one of a metallic material (e.g., W, Al, Cu), a metal nitride material (e.g., TiN, TaN, AlN, WN, MoN), a silicide material, or a semiconductor material (e.g., Si).

Capping patterns 135 may be formed on the gate patterns 133 and the gate dielectric layers 131 in the gap regions GR. The capping patterns 135 may fill upper portions of the gap regions GR. The capping patterns 135 may include, for example, a silicon nitride layer.

Figure 7E:
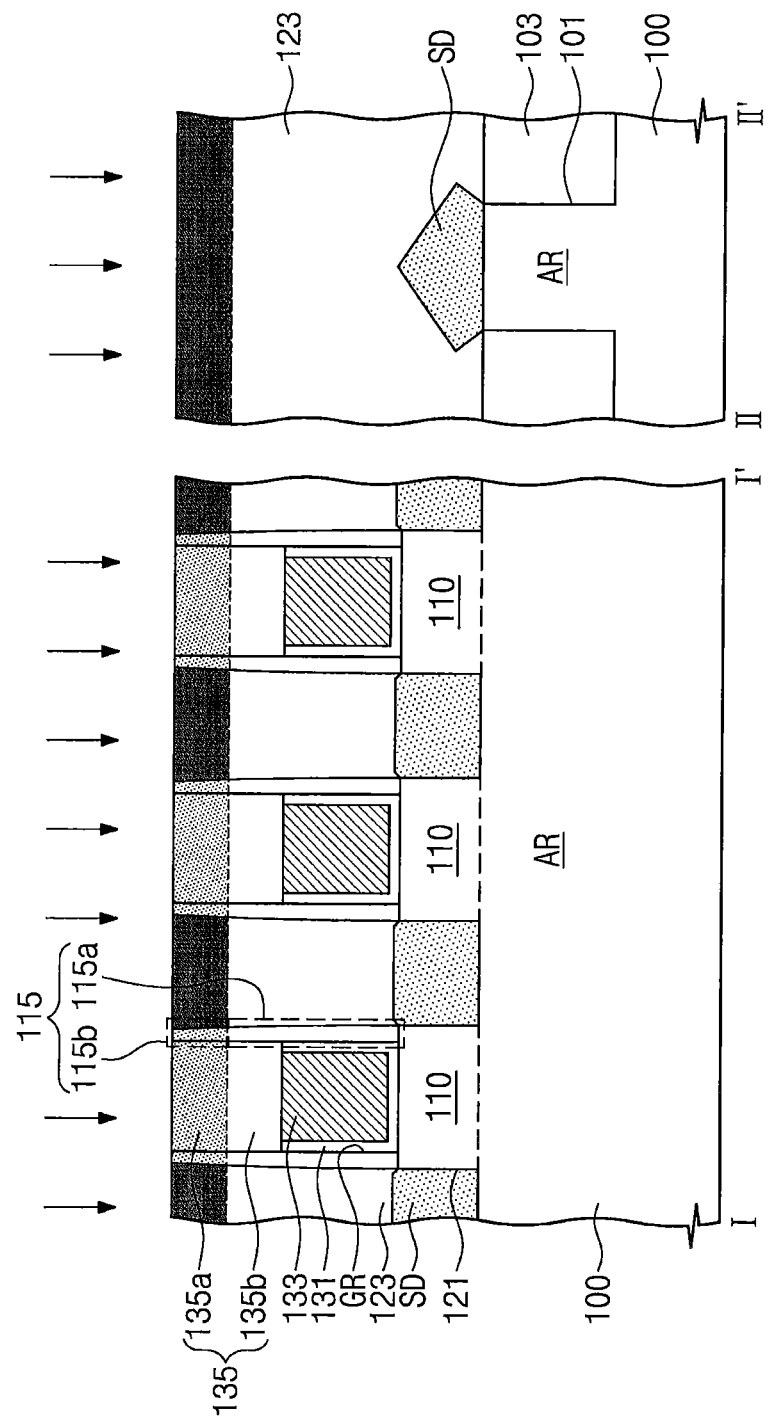

Referring to FIG. 7E, an impurity doping process may be performed on the capping patterns 135, the spacers 115, and the insulation layer 123. In some embodiments, impurities may be injected in a direction substantially perpendicular to top surfaces of the capping patterns 135, the spacers 115, and the insulation layer 123. The impurity doping process may dope impurities into upper portions of the capping patterns 135, the spacers 115, and the insulation layer 123. Upper portions of the capping patterns 135, the spacers 115, and the insulation layer 123 may have impurity concentrations greater than impurity concentrations of lower portions of the capping patterns 135, the spacers 115, and the insulation layer 123. In some embodiments, no impurity may be doped in the lower portions of the capping patterns 135, the spacers 115, and the insulation layer 123, and thus the lower portions of the capping patterns 135, the spacers 115, and the insulation layer 123 may be free of the impurities. The impurity concentration of the upper portions of the capping patterns 135 may be substantially the same as that of the upper portions of the spacers 115. The impurity doping process may be, for example, an ion implantation process or a plasma doping process. The impurities may be, for example, silicon (Si), boron (B), carbon (C), nitrogen (N), arsenic (As), phosphorous (P), oxygen (O), fluorine (F), argon (Ar), germanium (Ge), hydrogen (H), helium (He), or a combination thereof.

After the impurity doping process, a heat treatment process may be selectively performed on the capping patterns 135, the spacers 115, and the insulation layer 123. The heat treatment process may be carried out to cure surfaces of layers damaged by the impurity doping process.

Each of the capping patterns 135 may include an impurity-doped first part 135a and an impurity-undoped second part 135b. The first part 135a may be an upper portion of the capping pattern 135, and the second part 135b may be a lower portion of the capping pattern 135. Each of the spacers 115 may include an impurity-undoped first spacer segment 115a and an impurity-doped second spacer segment 115b. The first spacer segment 115a may be a lower portion of the spacer 115, and the second spacer segment 115b may be an upper portion of the spacer 115. The first part 135a may have a thickness substantially the same as that of the second spacer segment 115b.

Figure 7F:
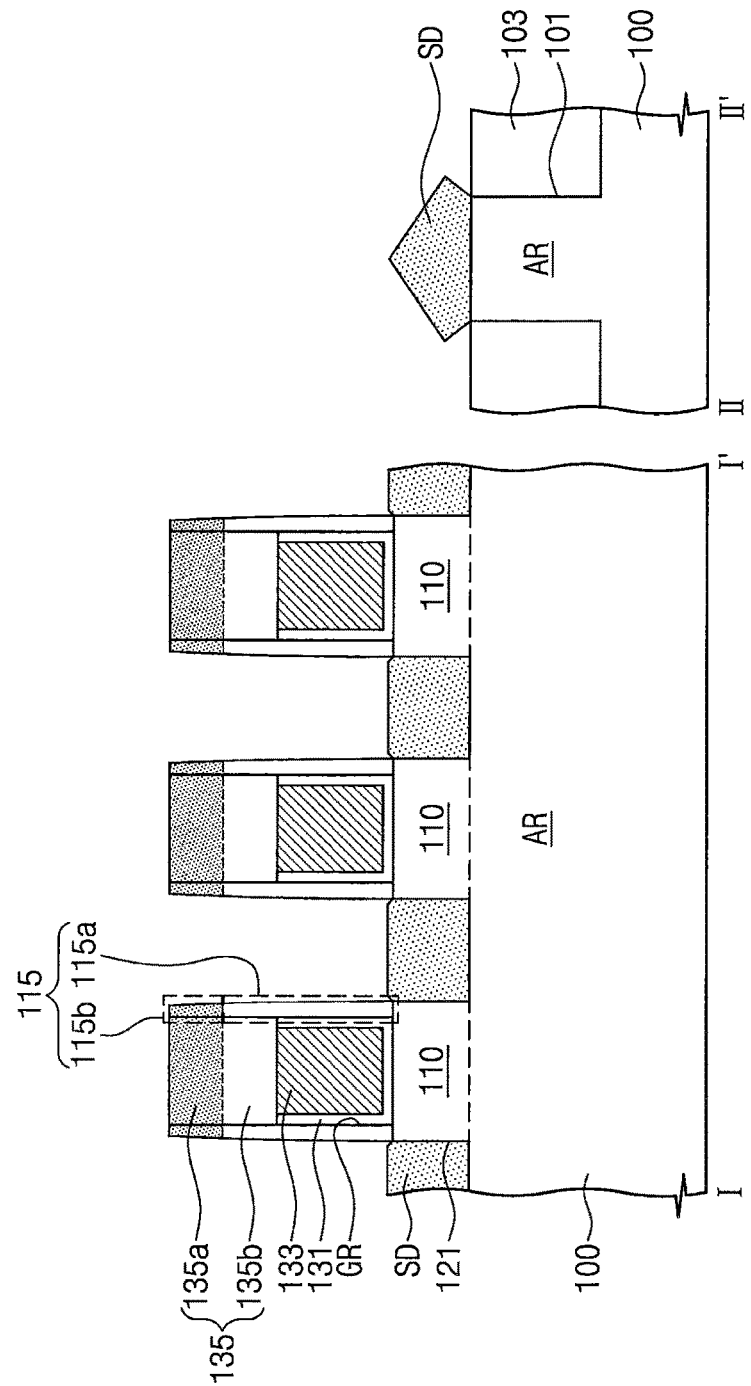

Referring to FIG. 7F, an etching process may be performed to remove the insulation layer 123. In order to utilize an etch selectivity between the capping patterns 135 and the insulation layer 123 and between the spacers 115 and the insulation layer 123, the etching process may use an etch recipe having a high etch selectivity with respect to the capping patterns 135 and the spacers 115 such that the insulation layer 123 may be selectively removed. The etching process may expose outer sidewalls of the second spacer segments 115b, outer sidewalls of the first spacer segments 115a, top surfaces of the source/drain patterns SD, and top surfaces of portions of the device isolation layer 103. For example, a dry etching process may be adopted as the etching process.

According to example embodiments of the present inventive concepts, an impurity may be doped in the upper portions of the capping patterns 135 such that it may be possible to maximize or increase an etch rate difference between the upper portions of the capping patterns 135 and the upper portion of the insulation layer 123. For example, an etch selectivity may be larger between impurity-doped upper portions of the capping patterns 135 and an impurity-doped upper portion of the insulation layer 123 than between impurity-undoped upper portions of the capping patterns 135 and an impurity-undoped upper portion of the insulation layer 123. Therefore, when the insulation layer 123 is selectively removed under a condition that the capping patterns 135 are exposed without a mask, it may be possible to reduce an etching amount of the upper portions of the capping patterns 135. In order to reduce capacitance between the gate patterns 133 and electrical lines (e.g., conductive lines) formed thereon, it may be preferable that the capping patterns 135 have a predetermined thickness. As it is possible to reduce an etching amount of the upper portions of the capping patterns 135, though the capping patterns 135 are not formed sufficiently thick, the capping patterns 135 may still have a desired thickness even after the etching process.

Moreover, impurities may be doped in the upper portions of the spacers 115 such that it may be possible to maximize or increase an etch rate difference between the upper portions of the capping patterns 135 and the upper portion of the insulation layer 123. For example, an etch selectivity may be larger between impurity-doped upper portions of the spacers 115 and an impurity-doped upper portion of the insulation layer 123 than between impurity-undoped upper portions of the spacers 115 and an impurity-undoped upper portion of the insulation layer 123. Therefore, when the insulation layer 123 is selectively removed under a condition that the spacers 115 are exposed without a mask, it may be possible to reduce an etching amount of the upper portions of the spacers 115, and thus it may also be possible to prevent short failure, caused by the removal of the spacers 115, between the gate patterns 133 and the source/drain contacts (see SDC of FIG. 2) formed thereby.

Referring back to FIG. 2, a source/drain contact SDC may be formed on the source/drain patterns SD. The formation of the source/drain contact SDC may include forming a conductive layer that fills a space between gate structures GS each including the gate dielectric layer 131, the gate pattern 133, and the capping pattern 135 and may cover the top surfaces of the capping patterns 135 and performing, for example, a polishing process on the conductive layer so as to expose the top surfaces of the capping patterns 135. A single source/drain contact SDC may extend in the second direction Y and may be electrically connected to a plurality of the source/drain patterns SD arranged in the second direction Y. The source/drain contact SDC may include at least one of, for example, a doped semiconductor material, a metallic material, or a metal nitride material.

An interlayer dielectric layer 150 may be formed on the source/drain contacts SDC and the capping patterns 135. The interlayer dielectric layer 150 may include, for example, a silicon oxide layer or a silicon nitride layer.

Figure 8A:
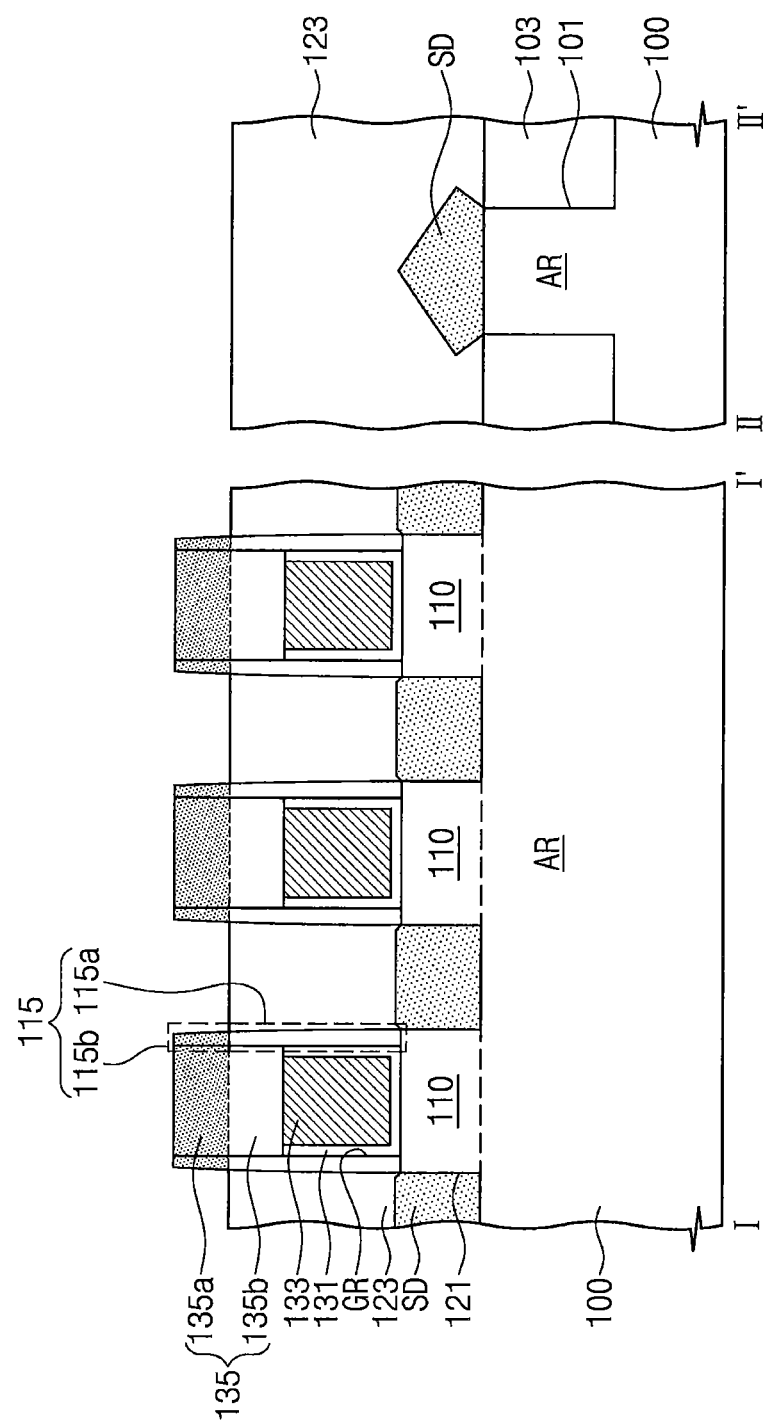
FIGS. 8A and 8B are cross-sectional views taken along the lines IT and II-II' of FIG. 1 illustrating a method of fabricating a semiconductor device according to example embodiments of the present inventive concepts.
Figure 8B:
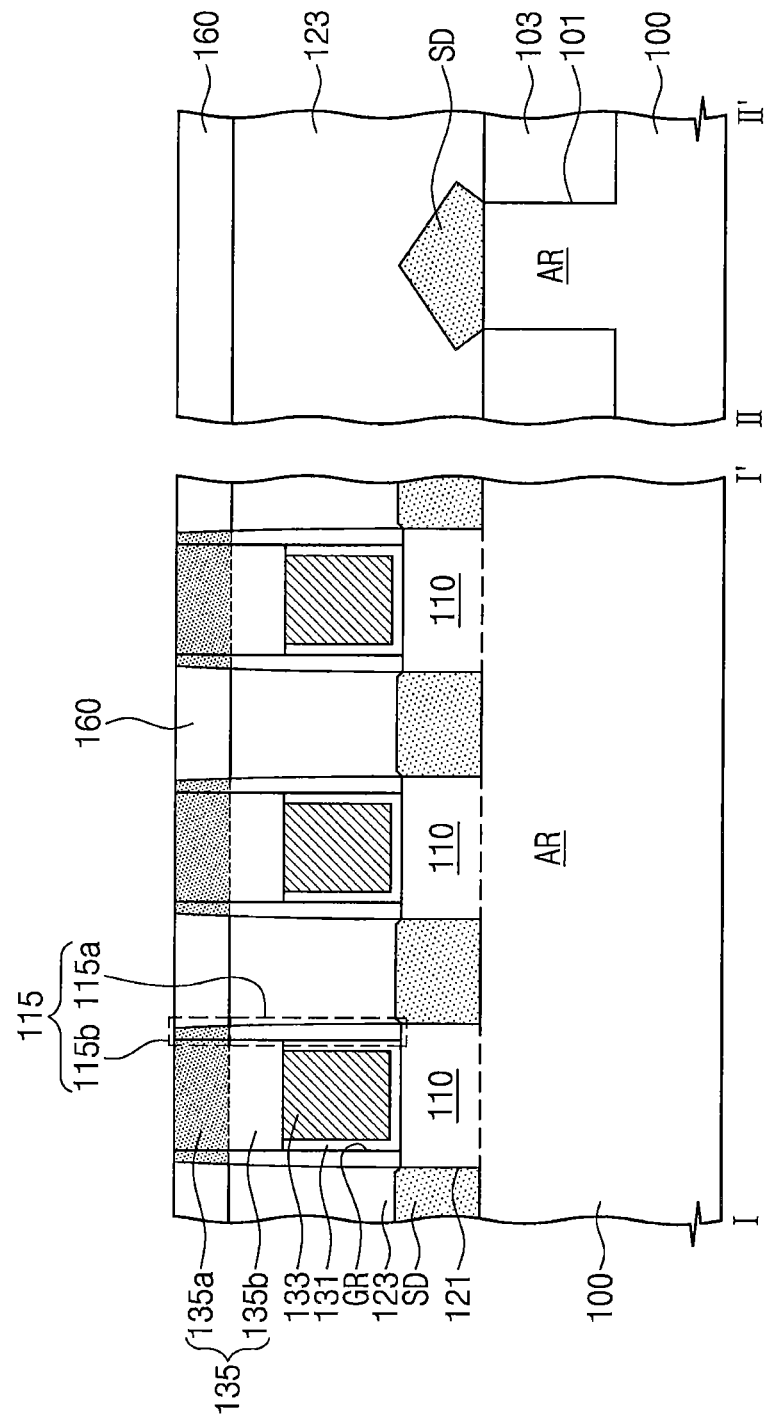

FIGS. 8A and 8B are cross-sectional views taken along the lines I-I' and II-II' of FIG. 1 illustrating a method of fabricating a semiconductor device according to example embodiments of the present inventive concepts. For brevity of the description, those components substantially the same as those discussed above are allocated the same reference numerals thereto, and a detailed explanation thereof will be omitted. In example embodiments described below, processes performed after the step illustrated in FIG. 7E will be described for brevity of the description.

Referring to FIG. 8A, an etching process may be performed to remove the impurity-doped upper portion of the insulation layer 123. The etching process may use an etch recipe having an etch selectivity with respect to the first part 135a and the second spacer segment 115b. For example, a wet etching process may be adopted as the etching process. In this case, for example, hydrofluoric acid (HF) may be used as an etchant. The removal of the upper portion of the insulation layer 123 may expose an outer sidewall of the second spacer segment 115b.

Referring to FIG. 8B, a second insulation layer 160 may be formed on the insulation layer 123. The second insulation layer 160 may be formed by forming an insulating layer to cover top surfaces of the insulation layer 123 and the capping patterns 135 and performing a polishing process so as to expose the top surfaces of the capping patterns 135. The second insulation layer 160 may cover an outer sidewall of the second spacer segment 115b. The second insulation layer 160 may be formed of the same material as that of the insulation layer 123. For example, the second insulation layer 160 may include a silicon oxide layer.

In some embodiments, certain impurities may possibly cause that an etch selectivity becomes smaller between impurity-doped first parts 135a and an impurity-doped upper portion of the insulation layer 123 than between pre-doped upper portions of the capping patterns 135 and a pre-doped upper portion of the insulation layer 123. In this case, the impurity-doped upper portion of the insulation layer 123 may be selectively removed and then an impurity-undoped second insulation layer 160 may be formed on the insulation layer 123. It therefore may be possible to increase an etch selectivity between the impurity-doped first part 135a and the impurity-undoped second insulation layer 160.

Referring back to FIG. 2, an etching process may be performed to selectively remove the second insulation layer 160 and the insulation layer 123. The etching process may thus expose outer sidewalls of the first and second spacer segments 115a and 115b and also expose top surfaces of the source/drain patterns SD. A source/drain contact SDC and an interlayer dielectric layer 150 may be sequentially formed.

Figure 9A:
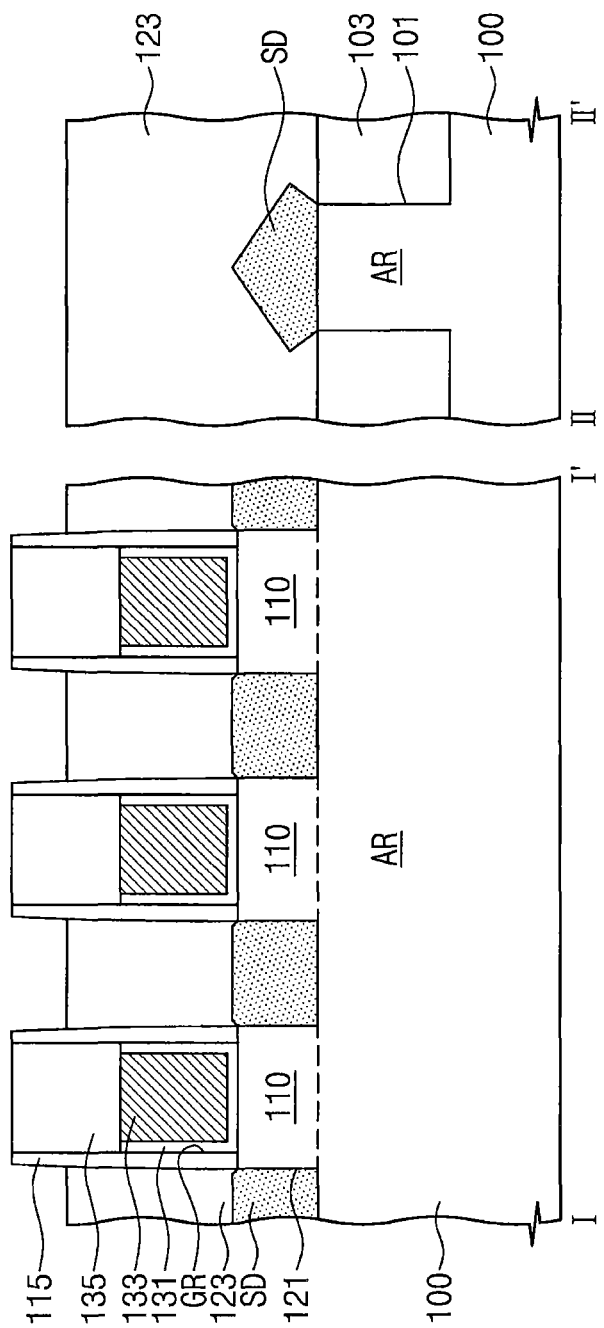
FIGS. 9A and 9B are cross-sectional views taken along the lines I-I' and II-IF of FIG. 1 illustrating a method of fabricating a semiconductor device according to example embodiments of the present inventive concepts.
Figure 9B:
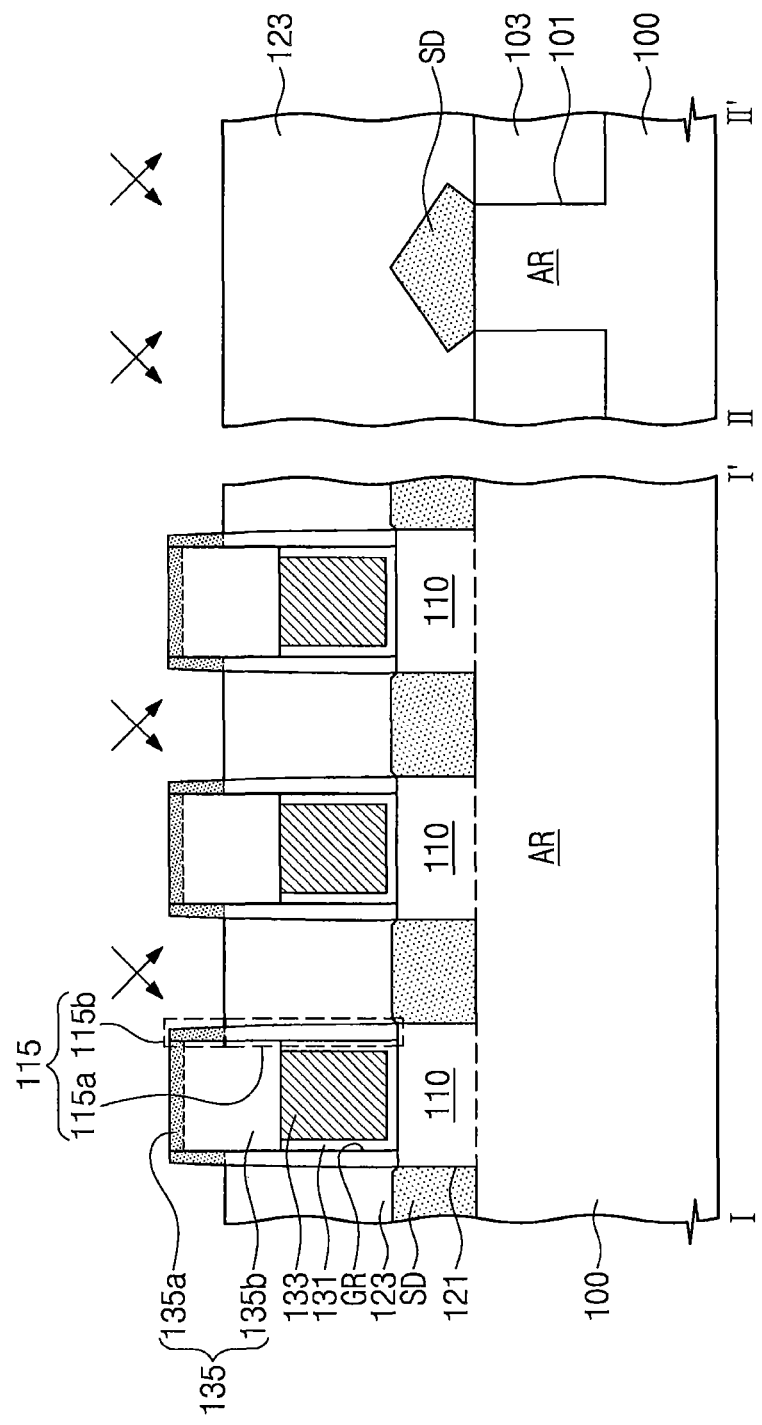

FIGS. 9A and 9B are cross-sectional views taken along the lines I-I' and II-IF of FIG. 1 illustrating a method of fabricating a semiconductor device according to example embodiments of the present inventive concepts. For brevity of the description, those components substantially the same as those discussed above are allocated the same reference numerals thereto, and a detailed explanation thereof will be omitted. In example embodiments described below, processes performed after the step illustrated in FIG. 7D will be described for brevity of the description.

Referring to FIG. 9A, the insulation layer 123 may be etched on its upper portion. Therefore, the insulation layer 123 may have a top surface positioned lower than those of the capping patterns 135. Upper outer sidewalls of the spacers 115 may be exposed by the insulation layer 123.

Referring to FIG. 9B, an impurity doping process may be performed on the capping patterns 135, the spacers 115, and the insulation layer 123. The impurity doping process may dope impurities in upper portions of the capping patterns 135 and upper portions of the spacers 115 exposed by the insulation layer 123. In some embodiments, impurities may be injected at about 0° to about 90° relative to a normal direction to top surfaces of the capping patterns 135 and the spacers 115. For example, a tilt ion implantation process where impurities are obliquely injected may be adopted as the impurity doping process. When an impurity injection angle is less than about 90° relative to the normal direction to the top surfaces of the capping patterns 135 and the spacers 115, no impurity may be doped in an upper portion of the insulation layer 123 because the capping patterns 135 may screen or block the insulation layer 123 whose top surface is positioned lower than those of the capping patterns 135. Accordingly, impurities may be doped in the upper portions of the spacers 115 and the upper portions of the capping patterns 135 exposed by the insulation layer 123, while no impurities may be doped in the upper portion of the insulation layer 123.

Each of the capping patterns 135 may include an impurity-doped first part 135a and an impurity-undoped second part 135b. Each of the spacers 115 may include impurity-undoped first and second spacer segments 115a and 115b. In some embodiments, first part 135a may have a thickness less that of the second spacer segment 115b as illustrated in FIG. 9B.

Referring back to FIG. 3, the insulation layer 123 may be removed to expose an outer sidewall of the first spacer segment 115a and top surfaces of the source/drain patterns SD. A source/drain contact SDC and an interlayer dielectric layer 150 may be sequentially formed.

Figure 10A:
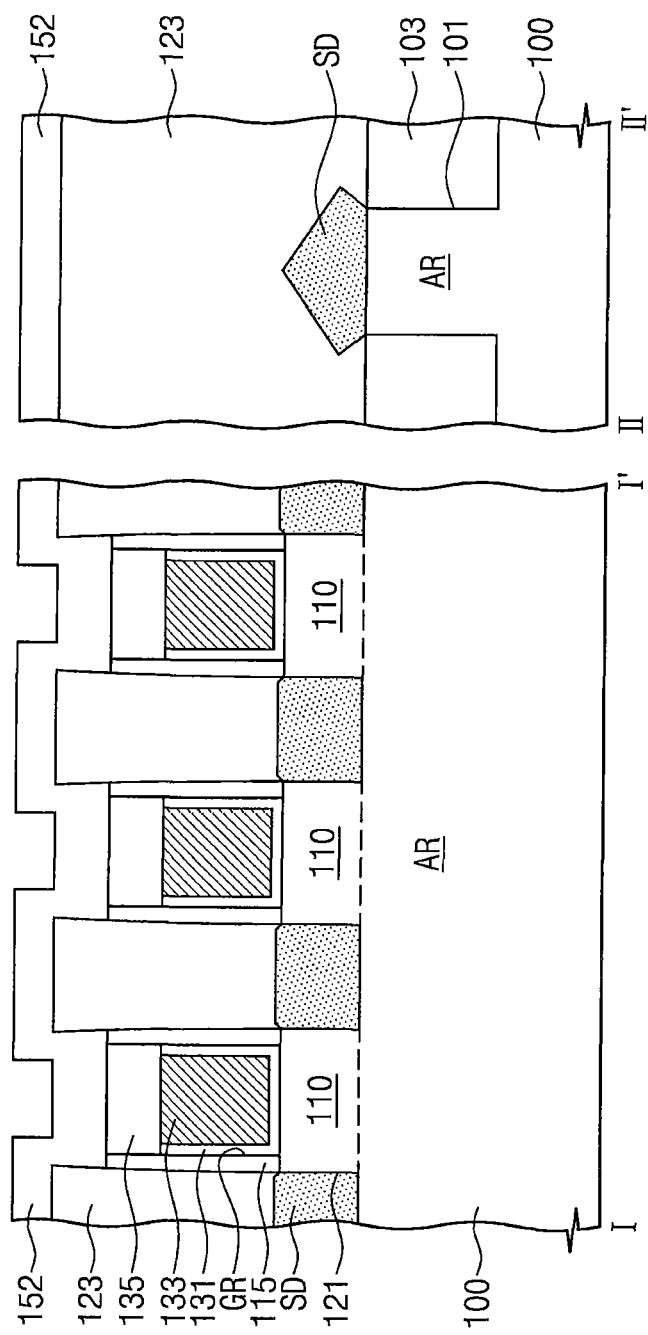
FIGS. 10A to 10C are cross-sectional views taken along the lines IT and II-IF of FIG. 1 illustrating a method of fabricating a semiconductor device according to example embodiments of the present inventive concepts.
Figure 10B:
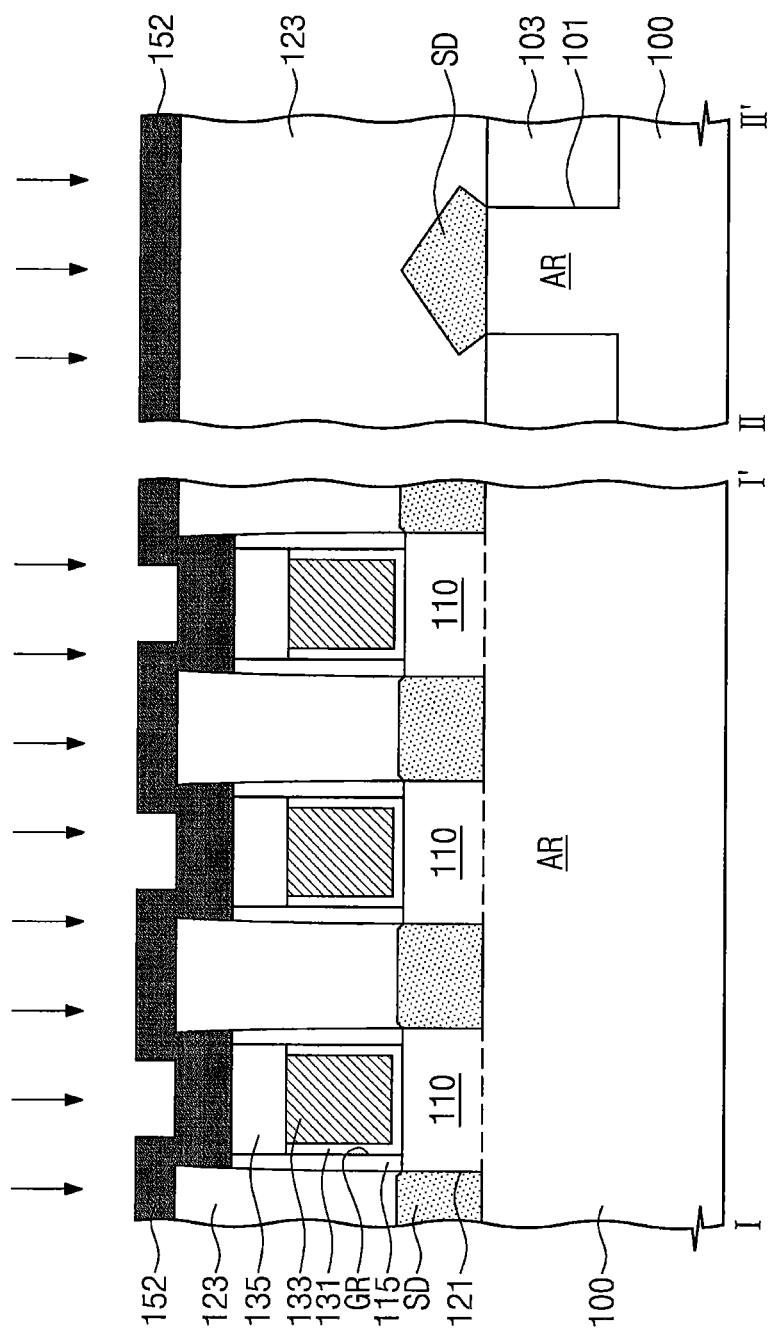
Figure 10C:
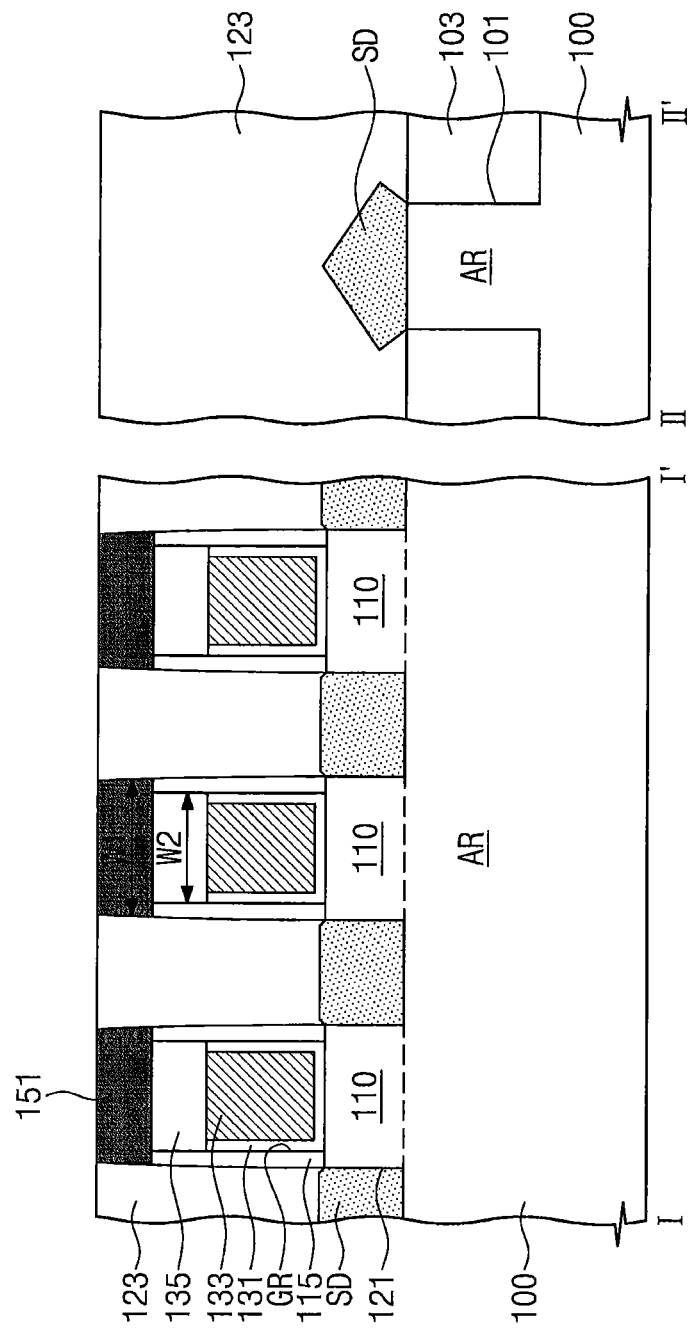

FIGS. 10A to 10C are cross-sectional views taken along the lines I-I' and of FIG. 1 illustrating a method of fabricating a semiconductor device according to example embodiments of the present inventive concepts. For brevity of the description, those components substantially the same as those discussed above are allocated the same reference numerals thereto, and a detailed explanation thereof will be omitted. In example embodiments described below, processes performed after the step illustrated in FIG. 7D will be described for brevity of the description.

Referring to FIG. 10A, an etching process may be performed to remove upper portions of the capping patterns 135 and upper portions of the spacers 115. Accordingly, top surfaces of the capping patterns 135 and the spacers 115 may be positioned lower than that of the insulation layer 123, and upper sidewalls of the insulation layer 123 may be exposed.

A capping layer 152 may be formed on the capping patterns 135 and the spacers 115. The capping layer 152 may cover the top surfaces of the capping patterns 135, the top surfaces of the spacers 115, the upper sidewalls of the insulation layer 123 exposed by the capping patterns 135 and the spacers 115, and the top surface of the insulation layer 123. The capping layer 152 may be formed to have a thickness substantially the same as or greater than those of the removed upper portions of the capping patterns 135. The capping layer 152 may be formed of the same material as that of the capping patterns 135. For example, the capping layer 152 may include a silicon nitride layer.

Referring to FIG. 10B, an impurity doping process may be performed on the capping layer 152. The impurity doping process may dope impurities in the capping layer 152. No impurities may be doped in upper portions of the capping patterns 135 and an upper portion of the insulation layer 123. In some embodiments, impurities may be injected in a direction substantially perpendicular to a top surface of the capping layer 152.

Referring to FIG. 10C, for example, a polishing process may be performed on the capping layer 152 so as to expose the top surface of the insulation layer 123. Hence, upper capping patterns 151 may be formed on the capping patterns 135 and the spacers 115. The upper capping patterns 151 may extend in the second direction Y. The upper capping patterns 151 may have a width W1 greater than that W2 of the capping patterns 135.

Referring back to FIG. 4, the insulation layer 123 may be selectively removed to expose top surfaces of the source/drain patterns SD, outer sidewalls of the spacers 115, and sidewalls of the upper capping patterns 151. A source/drain contact SDC and an interlayer dielectric layer 150 may be sequentially formed.

Figure 11A:
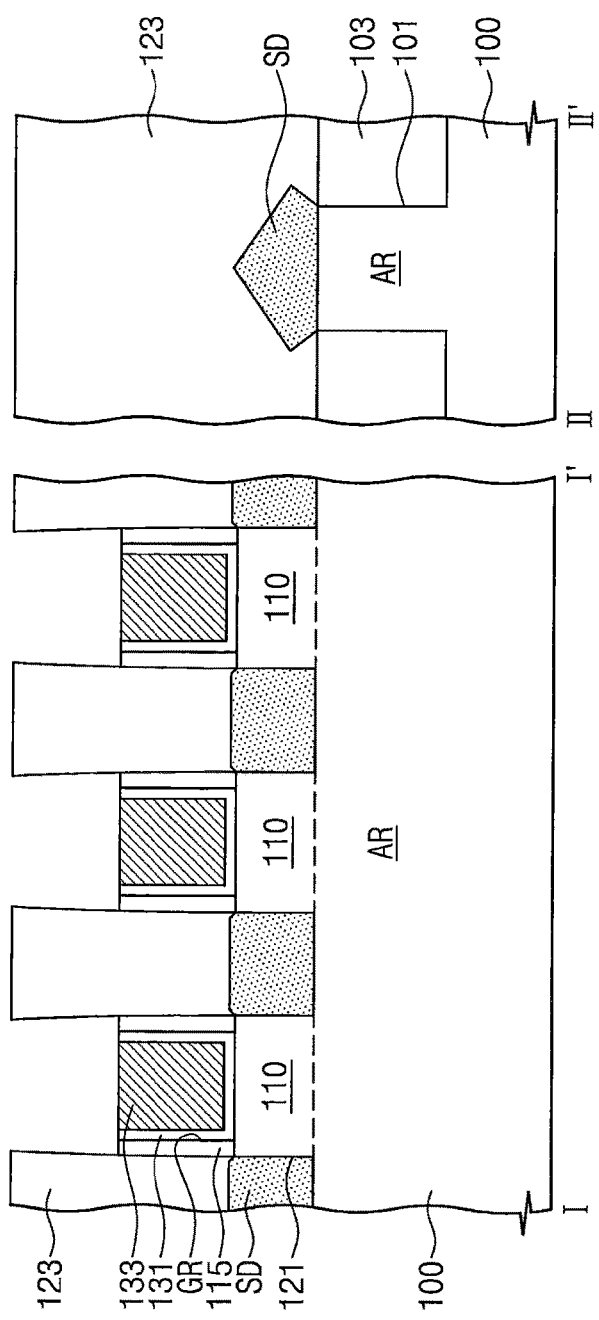
FIGS. 11A to 11C are cross-sectional views taken along the lines I-I' and II-IF of FIG. 1 illustrating a method of fabricating a semiconductor device according to example embodiments of the present inventive concepts.
Figure 11B:
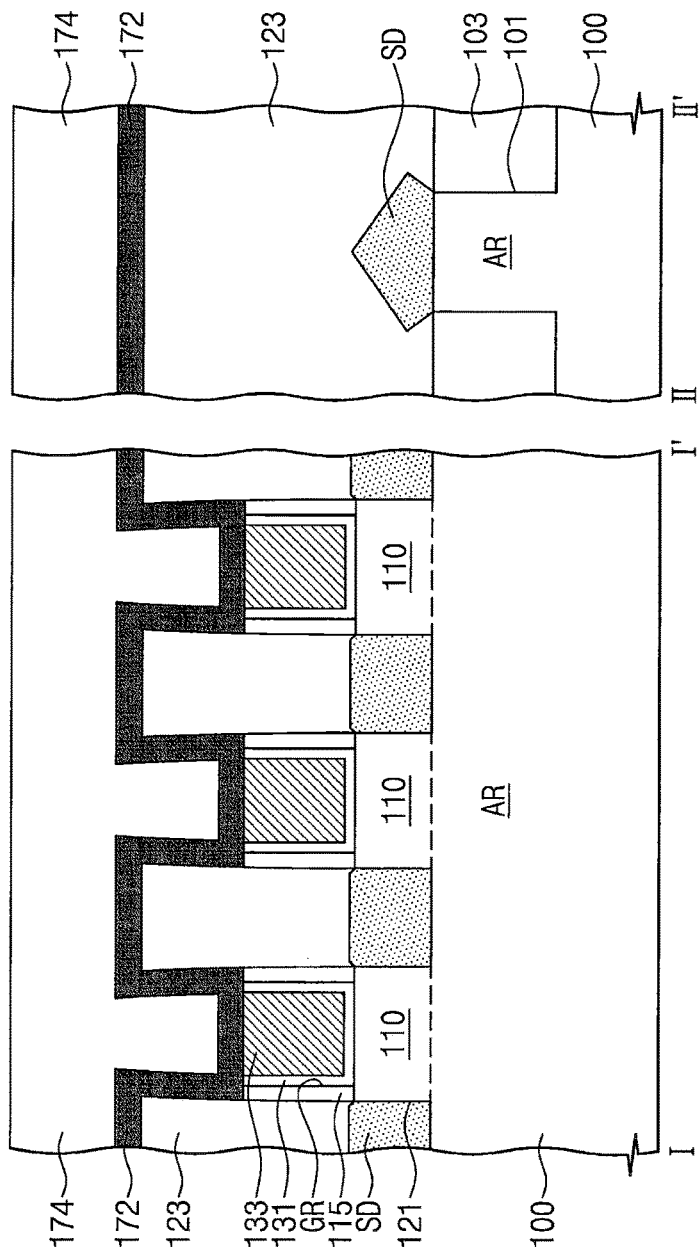
Figure 11C:
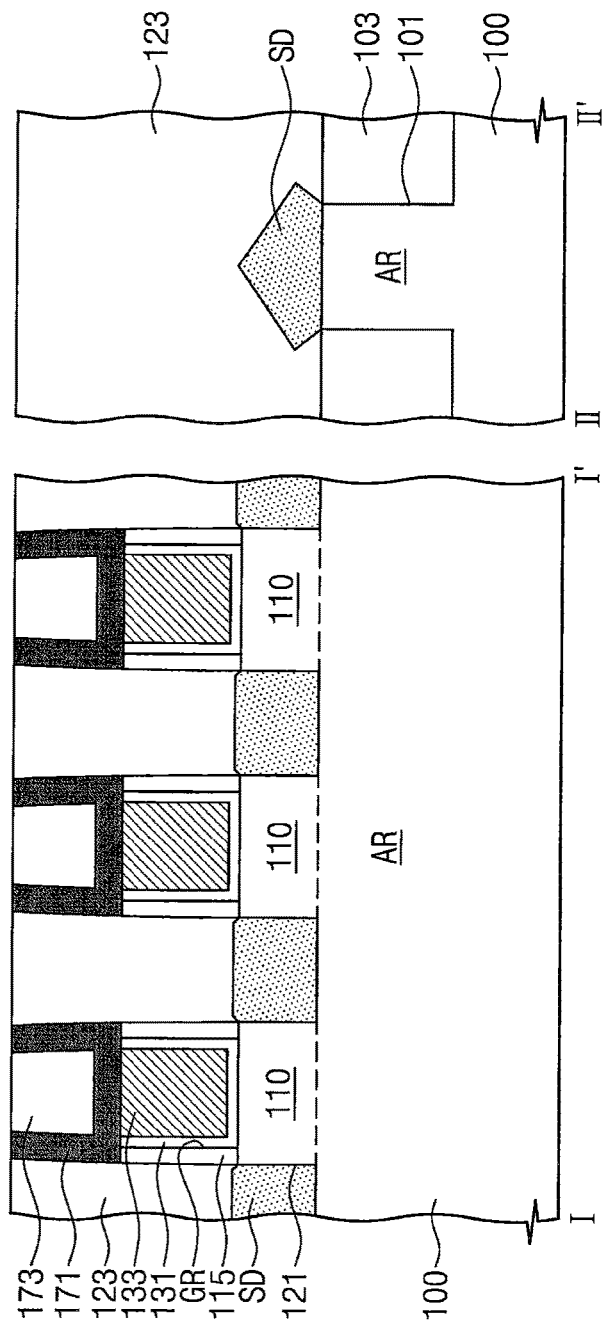

FIGS. 11A to 11C are cross-sectional views taken along the lines I-I' and II-IF of FIG. 1 illustrating a method of fabricating a semiconductor device according to example embodiments of the present inventive concepts. For brevity of the description, those components substantially the same as those discussed above are allocated the same reference numerals thereto, and a detailed explanation thereof will be omitted. In example embodiments described below, processes performed after the step illustrated in FIG. 7C will be described for brevity of the description.

Referring to FIG. 11A, the sacrificial structures 108 may be removed to form gap regions GR, and gate dielectric layers 131 and gate patterns 133 may be sequentially formed in the gap regions GR. An etching process may be performed to etch upper portions of the spacers 115, the gate dielectric layers 131, and the gate patterns 133. Accordingly, the gate dielectric layers 131, the gate patterns 133, and the spacers 115 may have top surfaces positioned lower than that of the insulation layer 123. In some embodiments, the top surfaces of the gate dielectric layers 131, the gate patterns 133, and the spacers 115 may be positioned at substantially the same level as illustrated in FIG. 11A. Upper sidewalls of the insulation layer 123 may be exposed by the gate dielectric layers 131, the gate patterns 133, and the spacers 115.

Referring to FIG. 11B, a first capping layer 172 may be formed on the insulation layer 123. The first capping layer 172 may be conformally formed on the top surfaces of the gate patterns 133, the top surfaces of the gate dielectric layer 131, the top surfaces of the spacers 115, the upper sidewalls of the insulation layer 123, and the top surface of the insulation layer 123. The first capping layer 172 may include, for example, a silicon nitride layer.

An impurity doping process may be performed on the first capping layer 172. Accordingly, impurities may be doped in the first capping layer 172. In some embodiments, impurities may be injected at about 0° to about 90° relative to a normal direction to a top surface of the first capping layer 172. For example, a tilt ion implantation process may be adopted as the impurity doping process. As such, impurities may be uniformly doped in portions of the first capping layer 172 formed on the top surface of the insulation layer 123 and in portions of the first capping layer 172 formed on the upper sidewalls of the insulation layer 123.

A second capping layer 174 may be formed on the first capping layer 172. The second capping layer 174 may fill a space defined by the first capping layer 172 and may cover the top surface of the first capping layer 172. The second capping layer 174 may be formed of the same material as that of the first capping layer 172. The second capping layer 174 may include, for example, a silicon nitride layer.

Referring to FIG. 11C, a planarization process may be performed on the first and second capping layers 172 and 174 so as to expose the top surface of the insulation layer 123. Therefore, lower capping patterns 171 and upper capping patterns 173 sequentially staked on the spacers 115, the gate dielectric layers 131, and the gate patterns 133 may be formed. The lower capping patterns 171 may extend between the insulation layer 123 and the upper capping patterns 173 from between the gate patterns 133 and the upper capping patterns 173. The upper capping patterns 173 may be buried in the lower capping patterns 171. The lower and upper capping patterns 171 and 173 may extend in the second direction Y.

Referring back to FIG. 5, the insulation layer 123 may be selectively removed to expose top surfaces of the source/drain patterns SD, outer sidewalls of the spacers 115, and outer sidewalls of the lower capping patterns 171. A source/drain contact SDC and an interlayer dielectric layer 150 may be sequentially formed.

Figure 12A:
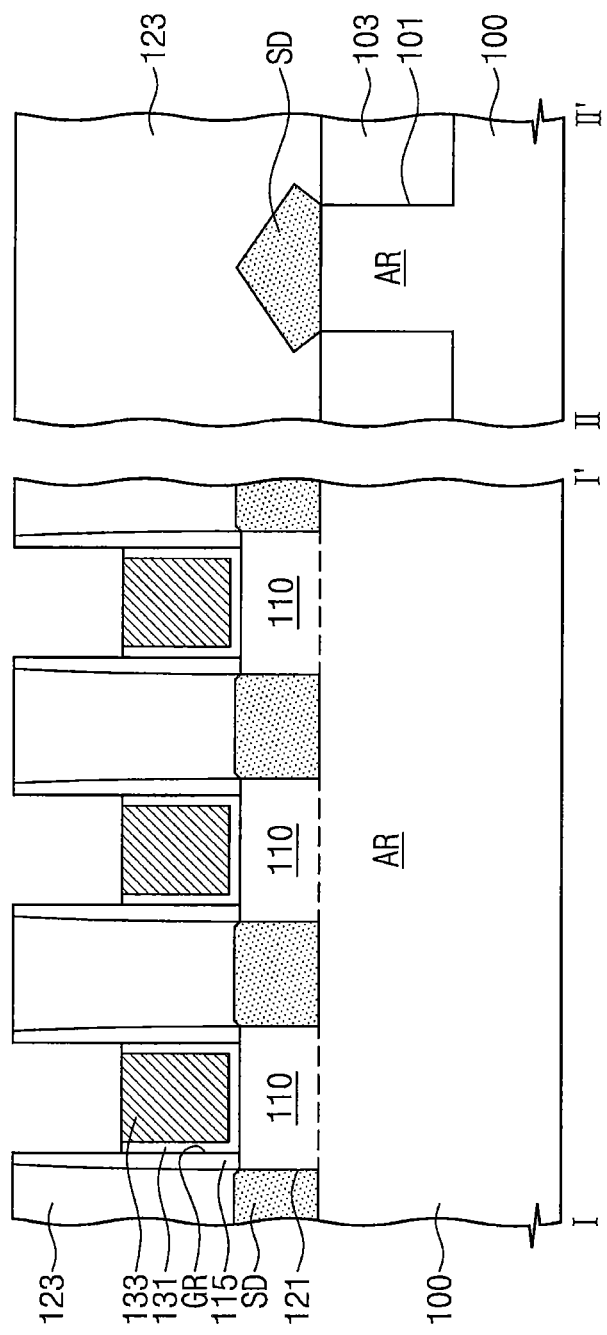
FIGS. 12A and 12B are cross-sectional views taken along the lines IT and II-IF of FIG. 1 illustrating a method of fabricating a semiconductor device according to example embodiments of the present inventive concepts.
Figure 12B:
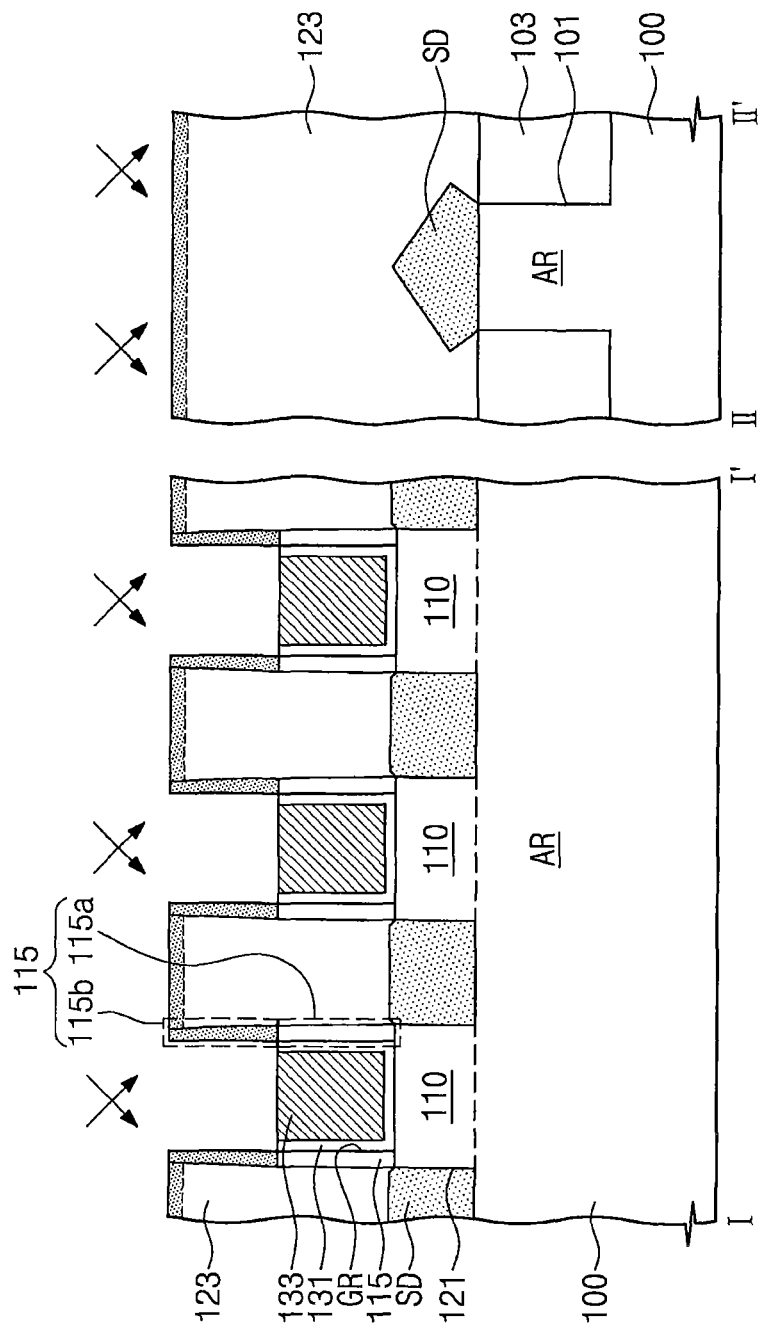

FIGS. 12A and 12B are cross-sectional views taken along the lines I-I' and II-IF of FIG. 1 illustrating a method of fabricating a semiconductor device according to example embodiments of the present inventive concepts. For brevity of the description, those components substantially the same as those discussed above are allocated the same reference numerals thereto, and a detailed explanation thereof will be omitted. In example embodiments described below, processes performed after the step illustrated in FIG. 7C will be described for brevity of the description.

Referring to FIG. 12A, the sacrificial structures 108 may be removed to form gap regions GR, and gate dielectric layers 131 and gate patterns 133 may be sequentially formed in the gap regions GR. An etching process may be performed to etch upper portions of the gate dielectric layers 131 and the gate patterns 133. Accordingly, top surfaces of the gate dielectric layer 131 may be positioned at the same level as those of the gate patterns 133, and upper inner sidewalls of the spacers 115 may be exposed by the gate dielectric layers 131 and the gate patterns 133.

Referring to FIG. 12B, an impurity doping process may be performed on the insulation layer 123. In some embodiments, impurities may be injected at about 0° to about 90° relative to a normal direction to a top surface of the insulation layer 123. For example, a tilt ion implantation process may be adopted as the impurity doping process. Accordingly, impurities may be doped in upper portions of the spacers 115 exposed by the gate dielectric layer 131 and the gate patterns 133 and may also be doped in an upper portion of the insulation layer 123. In some embodiments, no impurity may be doped in upper portions of the gate dielectric layers 131. Each of the spacers 115 may include an impurity-undoped first spacer segment 115a disposed between the gate dielectric layer 131 and the insulation layer 123 and an impurity-doped second spacer segment 115b disposed on the first spacer segment 115a.

Referring back to FIG. 6, impurity-undoped capping patterns 161 may be formed on the gate dielectric layers 131 and the gate patterns 133. The insulation layer 123 may be selectively removed to expose outer sidewalls of the first and second spacer segments 115a and 115b and also expose top surfaces of the source/drain patterns SD. A source/drain contact SDC and an interlayer dielectric layer 150 may be sequentially formed.

According to example embodiments of the present inventive concepts, impurities may be doped in the upper portions of the capping patterns formed on the gate patterns and in the upper portions of the spacers formed on the sidewalls of the capping patterns. It thus may be possible to increase an etch selectivity between the insulation layer that fills between the gate patterns and between the capping patterns and the upper portions of the capping patterns and between the insulation layer and the upper portions of the spacers. As a result, during etching the insulation layer without a mask, an etching amount of the upper portions of the capping patterns may be reduced such that the capping patterns may still have a desired thickness even after the etching process. Moreover, during etching the insulation layer without a mask, an etching amount of the upper portions of the spacers may be reduced such that it may be possible to prevent short failure caused by the removal of the spacers between the gate patterns and the source/drain contacts formed thereby.

Although the present inventive concepts have been described in connection with the example embodiments illustrated in the accompanying drawings, it will be understood to those skilled in the art that various changes and modifications may be made without departing from the technical spirit and essential feature of the present invention. The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
 a substrate;
 a device isolation layer that defines an active region of the substrate;
 an active fin vertically protruding from the active region and extending in a horizontal direction;
 a gate structure traversing the active fin, the gate structure including a gate pattern and a capping pattern on the gate pattern, the capping pattern including first impurities;
 a source/drain contact over the active region on a side of the gate structure; and
 a spacer that is between the capping pattern and the source/drain contact and between the gate pattern and the source/drain contact, the spacer including second impurities,
 wherein the capping pattern comprises a first part and a second part between the first part and the gate pattern,
 wherein the spacer comprises:
  a first spacer segment between the gate pattern and the source/drain contact; and
  a second spacer segment between the first part of the capping pattern and the source/drain contact, the second spacer segment having a concentration of the second impurities that is greater than a concentration of the second impurities of the first spacer segment.

2. The semiconductor device of claim 1, wherein a concentration of the first impurities of the first part of the capping pattern is greater than a concentration of the first impurities of the second part of the capping pattern.

3. The semiconductor device of claim 2, wherein the first part of the capping pattern has a first thickness in a vertical direction that is perpendicular to the horizontal direction,
wherein the second spacer segment has a second thickness in the vertical direction, and
wherein the second thickness is different from the first thickness.

4. The semiconductor device of claim 1, wherein the first impurities and the second impurities comprise a common element.

5. The semiconductor device of claim 4, wherein the concentration of the second impurities of the second spacer segment is equal to a concentration of the first impurities of the first part of the capping pattern, and
wherein the concentration of the second impurities of the first spacer segment is equal to a concentration of the first impurities of the second part of the capping pattern.

6. The semiconductor device of claim 1, wherein the first impurities comprise silicon (Si), boron (B), carbon (C), nitrogen (N), arsenic (As), phosphorous (P), oxygen (O), fluorine (F), argon (Ar), germanium (Ge), hydrogen (H), helium (He), or a combination thereof.

7. The semiconductor device of claim 6, wherein the first impurities and the second impurities comprise a common element.

8. A semiconductor device comprising:
a substrate;
a device isolation layer that defines an active region of the substrate;
an active fin vertically protruding from the active region and extending in a horizontal direction;
a gate structure traversing the active fin, the gate structure including a gate pattern and a capping pattern on the gate pattern;
a source/drain contact over the active region on a side of the gate structure; and
a spacer between the gate structure and the source/drain contact, the spacer including impurities,
wherein the spacer comprises:
a first spacer segment between the gate pattern and the source/drain contact; and
a second spacer segment between the capping pattern and the source/drain contact, wherein the first and second spacer segments have impurity concentrations different from each other.

9. The semiconductor device of claim 8, wherein the impurity concentration of the second spacer segment is greater than the impurity concentration of the first spacer segment.

10. The semiconductor device of claim 8, wherein the capping pattern comprises an insulating material of the spacer and is free of the impurities.

11. A semiconductor device comprising:
an active region of a substrate;
a gate structure on the active region, the gate structure comprising a gate electrode and a capping pattern sequentially stacked on the active region, the capping pattern comprising a first portion that defines an uppermost surface of the gate structure and has a first concentration of first impurities and a second portion having a second concentration of the first impurities that is less than the first concentration of the first impurities; and
a source/drain contact on the active region and on a side of the gate structure,
wherein the uppermost surface of the gate structure and an uppermost surface of the source/drain contact are coplanar.

12. The device of claim 11, wherein the first impurities comprise silicon (Si), boron (B), carbon (C), nitrogen (N), arsenic (As), phosphorous (P), oxygen (O), fluorine (F), argon (Ar), germanium (Ge), hydrogen (H), helium (He), or a combination thereof.

13. The device of claim 12, wherein the second portion of the capping pattern is free of the first impurities.

14. The device of claim 11, wherein the second portion and the first portion of the capping pattern are sequentially stacked on the gate electrode.

15. The device of claim 14, wherein the gate structure further comprises a spacer between the source/drain contact and the side of the gate structure,
wherein the spacer comprises an upper portion that defines the uppermost surface of the gate structure and comprises second impurities and a lower portion between the active region and the upper portion, and
wherein the upper portion of the spacer has a concentration of the second impurities that is greater than a concentration of the second impurities of the lower portion of the spacer.

16. The device of claim 15, wherein the first impurities and the second impurities comprise a common element.

17. The device of claim 15, wherein the first portion of the capping pattern has a first thickness in a vertical direction that is perpendicular to an upper surface of the active region,
wherein the upper portion of the spacer has a second thickness in the vertical direction, and
wherein the second thickness is different from the first thickness.

18. The device of claim 17, wherein the second thickness is greater than the first thickness.

19. The device of claim 14, wherein the gate structure further comprises a spacer between the source/drain contact and the side of the gate structure,
wherein the first portion of the capping pattern is on an uppermost surface of the spacer and defines the side of the gate structure,
wherein the second portion of the capping pattern is between the first portion of the capping pattern and the gate electrode, and
wherein a width of the first portion of the capping pattern is greater than a width of the second portion of the capping pattern.

20. The device of claim 11, wherein the gate structure further comprises a spacer between the source/drain contact and the side of the gate structure,
wherein the first portion of the capping pattern is on an uppermost surface of the spacer and defines the side of the gate structure, and an upper surface of the first portion of the capping pattern comprises a recess, and
wherein the second portion of the capping pattern is in the recess of the first portion and defines the uppermost surface of the gate structure.

* * * * *